(12) United States Patent
Barrenscheen

(10) Patent No.: US 11,556,890 B2
(45) Date of Patent: Jan. 17, 2023

(54) METHOD AND APPARATUS FOR USE IN MEASUREMENT DATA ACQUISITION

(71) Applicant: Infineon Technologies AG, Neubiberg (DE)

(72) Inventor: Jens Barrenscheen, Munich (DE)

(73) Assignee: Infineon Technologies AG, Neubiberg (DE)

(*) Notice: Subject to any disclaimer, the term of this patent is extended or adjusted under 35 U.S.C. 154(b) by 455 days.

(21) Appl. No.: 16/727,574

(22) Filed: Dec. 26, 2019

(65) Prior Publication Data

US 2020/0134550 A1 Apr. 30, 2020

Related U.S. Application Data

(62) Division of application No. 15/213,878, filed on Jul. 19, 2016, now Pat. No. 10,546,270.

(30) Foreign Application Priority Data

Jul. 20, 2015 (DE) .......................... 102015111753.3

(51) Int. Cl.
*G08C 15/12* (2006.01)
*G06Q 10/08* (2012.01)
(Continued)

(52) U.S. Cl.
CPC ............ *G06Q 10/087* (2013.01); *G01D 5/12* (2013.01); *G08C 15/12* (2013.01);
(Continued)

(58) Field of Classification Search
CPC ....... G01D 5/12; G08C 15/12; H03M 1/1205; H04Q 9/02
See application file for complete search history.

(56) References Cited

U.S. PATENT DOCUMENTS 8,165,832 B1 4/2012 Low et al.
9,256,220 B1 * 2/2016 Coffland ................ B25B 21/00
(Continued)

FOREIGN PATENT DOCUMENTS

CN 102480781 A 5/2012
CN 102640437 A 8/2012
(Continued)

OTHER PUBLICATIONS

German Patent Office, Office Action issued for DE 102015111753.3, 7 pgs., dated Feb. 29, 2016.
(Continued)

*Primary Examiner* — Andrew W Bee
(74) *Attorney, Agent, or Firm* — Banner & Witcoff Ltd.

(57) ABSTRACT

Methods for use in a measurement system. Some embodiments comprise at least one sensor unit and a control unit, wherein the at least one sensor unit is configured to detect a physical quantity and to form a sensor data signal. The method comprises, at the control unit, receiving a data receive signal from the sensor unit, and interpreting the data receive signal to be one of at least the sensor data signal and another data signal, wherein the interpreting is based on an attribute information intrinsic to the data receive signal. Furthermore, there is a sensor unit for use in measurement data acquisition, an apparatus configured to control a measurement data acquisition, a measurement system for use in measurement data acquisition, and a medium incorporating a sequence of operation steps that, when executed, perform a method for use in a measurement system for data acquisition.

18 Claims, 12 Drawing Sheets

(51) Int. Cl.
*G01D 5/12* (2006.01)
*H04Q 9/02* (2006.01)
*H03M 1/12* (2006.01)
*G01R 19/25* (2006.01)
*G01R 21/133* (2006.01)

(52) U.S. Cl.
CPC ............ *H03M 1/1205* (2013.01); *H04Q 9/02* (2013.01); *G01R 19/2513* (2013.01); *G01R 21/133* (2013.01)

(56) References Cited

U.S. PATENT DOCUMENTS

| | | | |
|---|---|---|---|
| 2005/0275528 A1* | 12/2005 | Kates | G08B 21/182 340/539.22 |
| 2008/0077336 A1 | 3/2008 | Fernandes | |
| 2008/0211638 A1* | 9/2008 | Masui | G06K 19/0717 340/10.2 |
| 2011/0098029 A1 | 4/2011 | Rhoads et al. | |
| 2011/0184675 A1 | 7/2011 | White et al. | |
| 2012/0054125 A1 | 3/2012 | Clifton et al. | |
| 2012/0078555 A1 | 3/2012 | Banhegyesi et al. | |
| 2012/0296483 A1 | 11/2012 | Seiler et al. | |
| 2013/0035788 A1 | 2/2013 | Divelbiss et al. | |
| 2013/0090745 A1 | 4/2013 | Frazer et al. | |
| 2014/0018969 A1 | 1/2014 | Forbes, Jr. | |
| 2014/0097691 A1 | 4/2014 | Jackson et al. | |
| 2015/0006115 A1 | 1/2015 | Svoboda et al. | |
| 2016/0126966 A1* | 5/2016 | Huang | H03M 1/1245 341/122 |
| 2016/0146492 A1* | 5/2016 | Tomomatsu | F24F 11/62 700/276 |
| 2017/0024690 A1 | 1/2017 | Barrenscheen | |

FOREIGN PATENT DOCUMENTS

| | | |
|---|---|---|
| CN | 103973457 A | 8/2014 |
| DE | 10226458 B3 | 1/2004 |
| DE | 102009047542 A1 | 6/2011 |
| DE | 102012019781 A1 | 4/2013 |
| JP | 2007259463 A | 10/2007 |

OTHER PUBLICATIONS

Office Action dated Mar. 14, 2018 for Chinese Application No. 201610571697.7.

* cited by examiner

METHOD AND APPARATUS FOR USE IN MEASUREMENT DATA ACQUISITION

CROSS-REFERENCE TO RELATED APPLICATIONS

The present application is a divisional application of U.S. patent application Ser. No. 15/213,878, filed on Jul. 19, 2016, and issued as U.S. Pat. No. 10,546,270 on Jan. 28, 2020, which claims the benefit of the filing date of German Patent Application No. 102015111753.3, filed on Jul. 20, 2015, the contents of each of which are incorporated herein by reference in their entireties.

BACKGROUND

The concepts and embodiments disclosed herein relate to the technical field of measurement data acquisition. Typically, measurement data are obtained by using a sensor unit. The sensor unit comprises a transducer coupled to the probe that is sensitive to a physical quantity to be detected. The transducer is configured to output an analog measurement signal (herein also referred to as analog sensor signal) that is commensurate with an amount of the physical quantity as 'seen' by the probe.

In many applications it is impossible to place processing device in the immediate vicinity of the transducer. Consequently, the analog measurement signal needs to travel a certain distance before being processed. The longer the distance that the analog measurement signal needs to travel, for example on a transmission line, the more the analog measurement signal distorted or otherwise deteriorated, for example due to damping or due to noise on the transmission line, and the less the analog measurement signal eventually seen may still be a true representation of the measured quantity. Therefore, the sensor unit may comprise an analog to digital converter that is located in proximity to the transducer and coupled to the transducer in order to receive the analog sensor signal and configured to output a digital sense signal that represents essentially the information acquired by a transducer. In a typical application the sensor unit is coupled to the processing unit and configured to transmit the digital sense signal to the processing unit for processing. Since the transmission of digital signals is typically more robust against adverse effects of damping and noise, the digital sense signal received at the processing unit provides a representation of the measured quantity that is closer to the truth than a direct transmission of the analog signal from the transducer to the processing unit could provide.

Sometimes measurement of a given physical quantity requires the corresponding sensor unit to operate in harsh electrical conditions. In particular, a reference voltage, for example provided by ground, many vary wildly. Therefore, a barrier can be provided that electrically separates the sensor unit from the control unit. At the barrier, a sensor reference voltage, herein also referred to as sensor ground potential, used in the measurement data acquisition, and a controller reference voltage, herein also referred to as control unit ground potential, used in the processing of acquired data, are separated from one another.

Interfaces to communicate across barriers that effectively separate electrical conditions on the side of the control unit from the harsh electrical conditions on the side of the sensor unit require significant effort in engineering and quality.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

Representative implementations of devices and techniques provide communication between one or more sensor units and a control unit in a measurement system. Some embodiments are particularly useful where the communication crosses a barrier that electrically separates the sensor unit(s) from the control unit.

Described below are embodiments related to a method for use in a measurement system, an interface for use in a measurement system, a control unit for use in a measurement system, a measurement system, and a sensor unit.

This summary is submitted with the understanding that it will not be used to interpret or limit the scope or meaning of the claims. This summary is not intended to identify key features or essential features of the claimed subject matter, nor is it intended to be used as an aid in determining the scope of the claimed subject matter. Other methods, apparatus and systems are also disclosed. Those skilled in the art will recognize additional features and advantages upon reading the following detailed description, and upon viewing the accompanying drawings.

The independent claims define the invention in various aspects. The dependent claims define embodiments according to the invention in the various aspects.

BRIEF DESCRIPTION OF THE DRAWINGS

The detailed description is set forth with reference to the accompanying figures. In the figures, the left-most digit of a reference numeral identifies the figure in which the reference numeral appears. The use of the same second and third digits in reference numerals in different figures indicates similar or identical items.

DETAILED DESCRIPTION OF THE INVENTION

Figure 1:
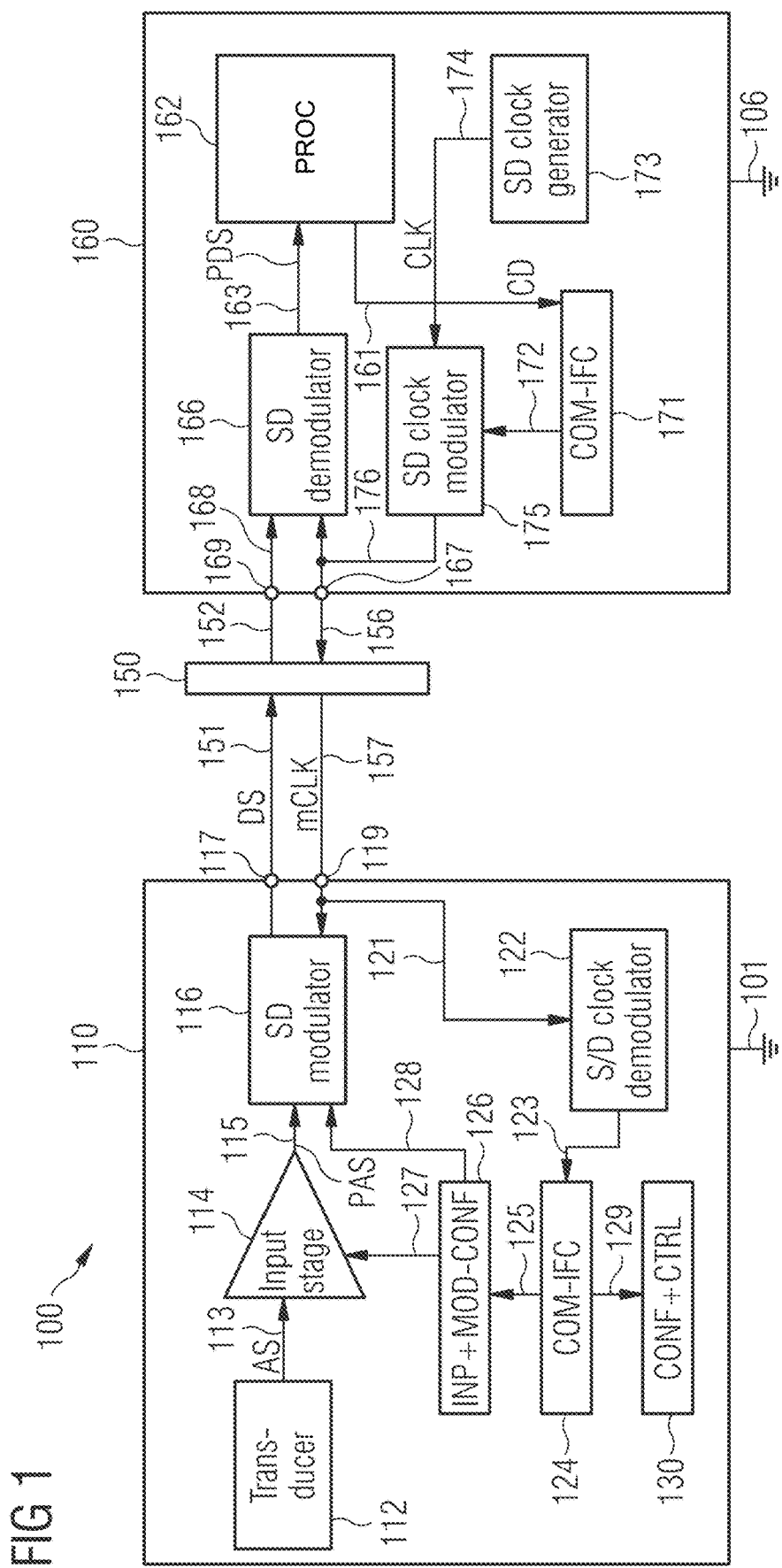
FIG. 1 illustrates a block diagram of a measurement system according to some embodiments.

As will become apparent from the following detailed description, in particular when read in conjunction with the accompanying figures, the embodiments described herein can be useful, for example, in the field of measurement data acquisition. In comparison with conventional solutions at least one effect can be improved efficiency in usage of sensor units for measurement data acquisition. For example, a control unit configured to control the measurement data acquisition can signal settings information to the sensor unit for the sensor unit to perform data acquisition according to the settings information, or, for example, to save power. For another example, the sensor unit can, upon startup or upon wakeup, transmit a first measurement result to the control unit indicative of the sensor unit itself being about to be brought into an operative mode and/or indicative of a presence or absence of a physical quantity.

In some embodiments an analog-to-digital converter is biased, i.e., referenced to a sensor reference voltage, while the control unit is referenced to a control unit reference voltage, wherein the sensor reference voltage can differ from the control unit reference voltage. At least one effect can be that the control unit is operated at a stable reference voltage essentially irrespective of variations of the sensor reference voltage, whereby operation is secure.

Some embodiments comprise modulating a clock signal for use by sensor unit(s) according to other information than timing. In some embodiments the modulating comprises varying Sigma-Delta clock cycles to form the clock signal in order to represent a bit value. At least one effect can be that, for example based on a communications protocol such as the Universal Asynchronous Receiver Transmitter (UART) communications protocol, the another information can be communicated across the interface. In particular, at the interface, a fixed timing relation between transmitting the clock signal from the interface to the sensor unit and receiving the digital signal from the sensor unit at the interface can be established. At least one effect can be that a number of communication lines required to be interfaced at the barrier can be kept low.

Implementations are explained in more detail below using a plurality of examples. Although various implementations and examples are discussed here and below, further implementations and examples may be possible by combining the features and elements of individual implementations and examples. In many applications, a plurality of sensor units collectively form part of a measurement system that, in addition, can comprise a control unit configured as the processing unit to process the measurement data. The sensor units share one interface to the control unit. Further, while the sensor units are configured to transmit the digital data signal across the interface to the control unit, many applications do not allow the control unit to communicate requests to the sensor unit, since they do not provide any communication line from the control unit across the interface to the sensor unit.

Figure 11:
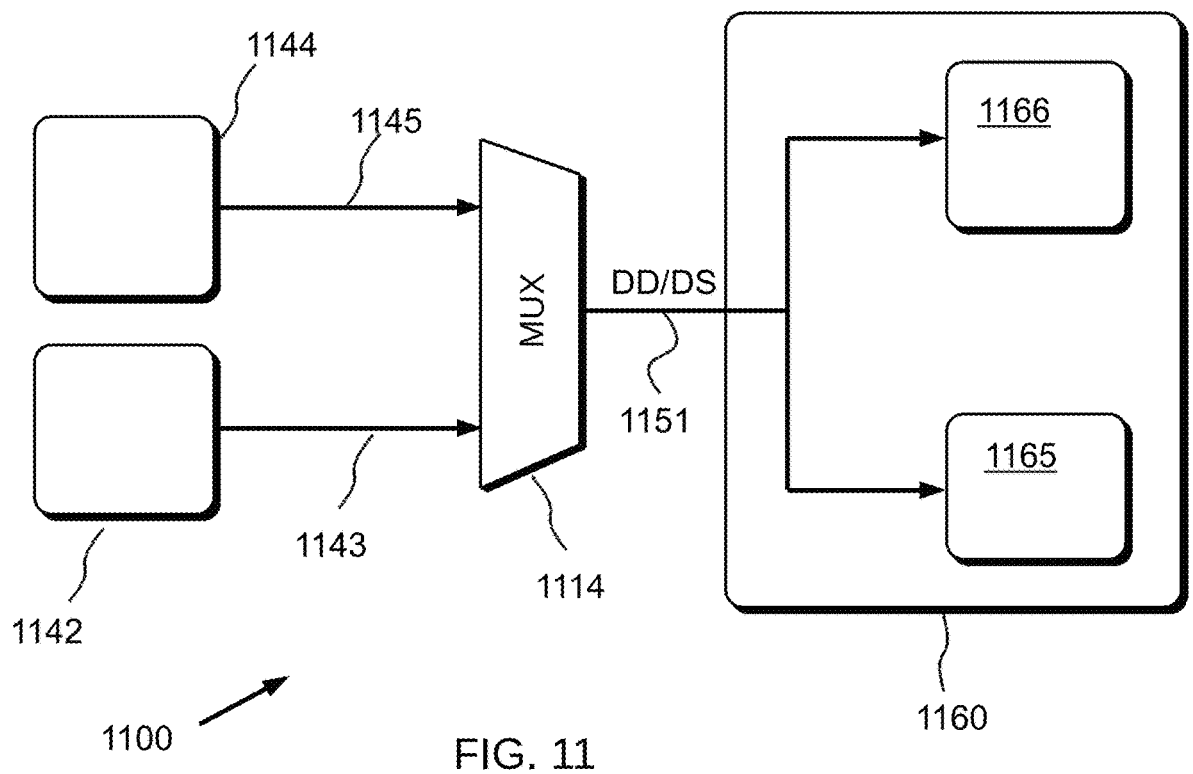
FIG. 11 illustrates a block diagram of a system according to some embodiments.

FIG. 11 illustrates a block diagram of a system 1100 according to some embodiments. System 1100 comprises a first measurement channel that, for example, in some embodiments comprises a first sensor unit 1142 and a first signal line 1143. System 1100 further comprises a second measurement channel that, for example, in some embodiments comprises a second sensor unit 1144 and a second signal line 1145. System 1100 further comprises a multiplexer 1114. Multiplexer 1114 is coupled via first signal line 1143 to first sensor unit 1142 and coupled via second signal line 1145 to second sensor unit 1144. Multiplexer 1114 is coupled, via an output signal line 1151, to a control unit 1160. Multiplexer 1114 is configured to multiplex signals, received from first sensor unit 1142 and from second sensor unit 1144, and to provide, via output signal line 1151, a serial digital data signal DD, herein also briefly referred to as DS, to data receiving unit 1160.

Control unit 1160 comprises a first receiver 1165 for data of the first measurement channel and a second receiver 1166 for data of the second measurement channel. Control unit 1160 is configured to provide DS or data represented by the serial digital signal DD (DS) to first receiver 1165 and to second receiver 1166 consistent with the origin of the provided data being the first sensor unit 1142 and the second sensor unit 1144, respectively. In some embodiments, first receiver 1165 is provided as an SD demodulator. In some embodiments, second receiver 1166 is provided as a comparator. First receiver 1165 and second receiver 1166 are configured to provide first measurement channel data and second measurement channel data, respectively, so as to enable, for example, further processing. The person skilled in the art could contemplate variants. For example, the number of sensor units, and corresponding measurement data channels, need not be two.

Figure 12:
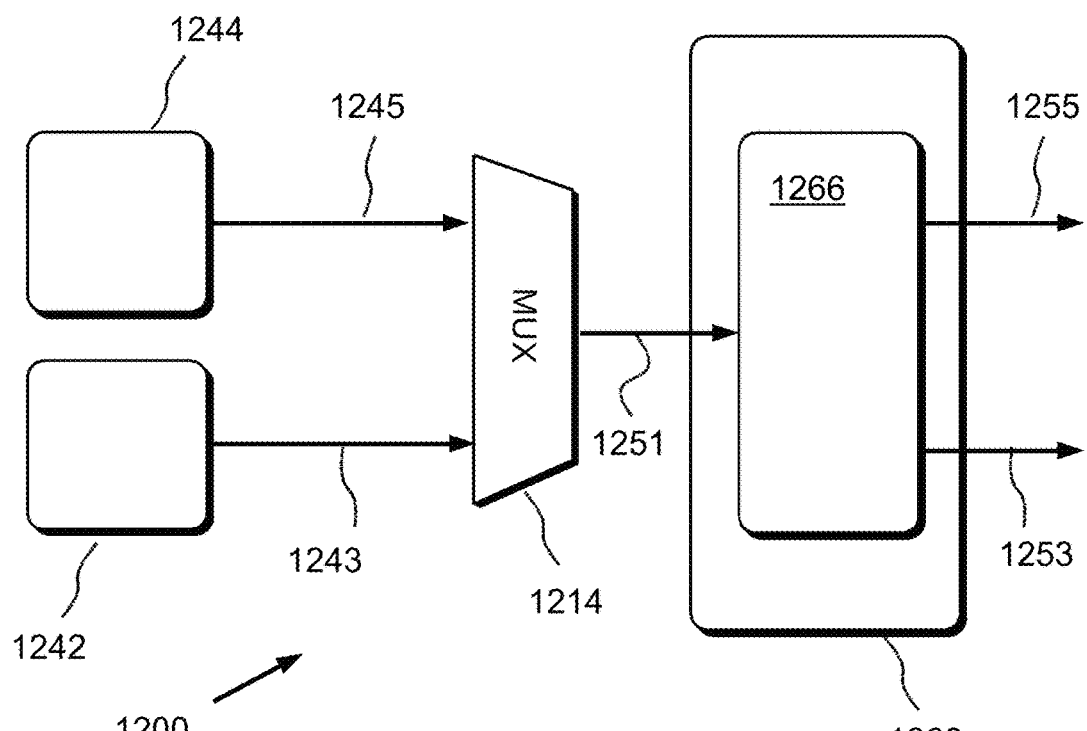
FIG. 12 illustrates a block diagram of a system according to some embodiments.

FIG. 12 illustrates a block diagram of a system 1200 according to some embodiments. System 1200 is a variant of system 1100 illustrated in FIG. 11. Like system 1100 shown in FIG. 11, system 1200 comprises a first measurement channel comprising, for example, in some embodiments a first sensor unit 1242 and a first signal line 1243. System 1200 also comprises a second measurement channel comprising, for example, in some embodiments a second sensor unit 1244 and a second signal line 1245. Further, system 1200 also comprises a multiplexer 1214. Multiplexer 1214 is coupled via first signal line 1243 to first sensor unit 1242 and coupled via second signal line 1245 to second sensor unit 1244. Multiplexer 1214 is coupled, via an output signal line 1251, to a control unit 1260. Multiplexer 1214 is configured to multiplex signals, received from first sensor unit 1242 and from second sensor unit 1244, and to provide, via output signal line 1251, a serial digital signal DD/DS to data receiving unit 1260.

Control unit 1260 comprises a single receiver 1266 for data of the first measurement channel and for data of the second measurement channel. Control unit 1260 is configured to provide the serial digital signal DD or data represented by DS to single receiver 1266. Single receiver 1266 is configured to output, consistent with the origin of the provided data being the first sensor unit 1242 and the second sensor unit 1244, respectively, first measurement data on a first data output line 1253 and second measurement data on a second data output line 1255. In some embodiments, single receiver 1266 is provided as an SD demodulater. In some embodiments, single receiver 1266 is provided as a comparator. Single receiver 1266 is configured to provide first measurement channel data and second measurement channel data via first and second data output line 1253 and 1255, respectively, so as to enable, for example, further processing.

Having regard to the above stated examples, the person skilled in the art could contemplate variants. For example, the number of sensor units, and corresponding measurement data channels, need not be two. Signal lines, in particular where configured to transmit digital signals, need not be single lines but could also be arranged as multibit parallel bus lines. However, as will become apparent when studying further implementations with reference to the figures below, in some implementations, the system's output line for transmission of signals from the sensor unit(s) to the control unit may be a serial signal line rather than a multibit parallel bus.

Figure 13:
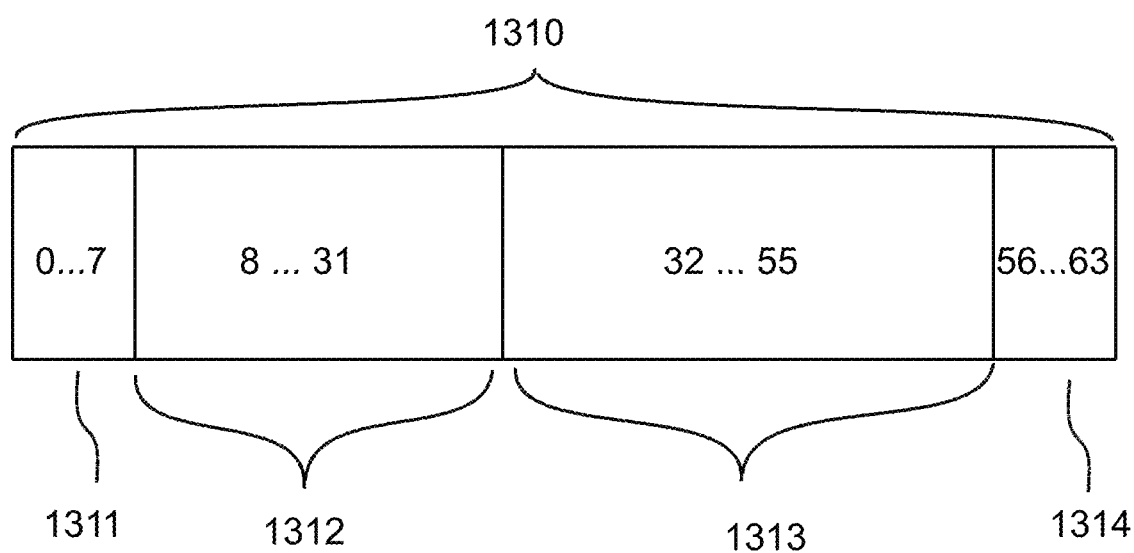
FIG. 13 illustrates a representation of data according to some implementations.

FIG. 13 illustrates an exemplary combined representation 1310 of measurement data according to some implementations, for example, in digital signal DD (DS) output from multiplexer 1114, 1214. In some embodiments, the measurement data originate from a first channel of measurement and from a second channel of measurement. In the example, representation 1310 is 64 bits wide. Representation 1310 comprises a first byte 1311 (bit 0 to 7) and a first 24-bit word 1312 (bit 8 to 31), and a second 24-bit word 1313 (bit 32 to 55) and a second byte 1314 (bit 56 to 63). In some implementation the first 24-bit word 1312 is associated with the first byte 1311 and the second byte 1314 is associated with the second 24-bit word. In some embodiments the first byte 1311 and/or the second byte 1314 are used to represent control information such as an identity of the sensor unit that provided the data represented in the associated 24-bit word. In some implementations, first byte 1311 and second byte 1314 are not used. At least one effect can be that the transmission of data can be more secure, since very low voltage levels and/or very high voltage levels can be ignored when avoiding use of most significant bits and least significant bits in a digital representation of an analog signal.

In some implementations, first receiver 1165 and second receiver 1166, or single receiver 1266, are configured to interpret the serial digital signal DD/DS in terms of validity. In the example shown in FIG. 13, bit values in a range of from bit 8 to bit 31 can be interpreted as valid to represent first channel measurement data, while other bit values are interpreted as invalid with regards to first channel measurement data. For another example, bit values in a range of from bit 32 to bit 55 can be interpreted as valid to represent second channel measurement data, while other bit values are interpreted as invalid with regards to second channel measurement data.

The skilled person could of course contemplate another number of bit to be used in the representation and also another partition. Also, the skilled person could contemplate to interleave first and second bytes and/or first and second 24-bit words, for example by using odd numbered bits for the first 24-bit word and even numbered bit for the second 24-bit word. At least one effect can be an increased resistance to data transmission errors from the multiplexer 1114, 1214 to the control unit 1160, 1260.

Exemplary Configurations with Clock Signal Modulation

In some implementations, as shown in FIG. 1, a measurement system 100 comprises a sensor unit 110 and a control unit 160. Although reference is made herein to one sensor unit 110 it should be understood that the number of sensor units comprised in measurement system 100 is not limited to one. Measurement system 100 can comprise more than one sensor unit. Sensor unit 110 and control unit 160 are electrically separated from each other by an isolation barrier. In particular, sensor unit 110 is coupled to a first ground 101 that defines a measurement ground potential, while control unit 160 is coupled to a second ground 106 that defines a controller ground potential. The measurement ground potential at first ground 101 and the controller ground potential at second ground 106 are essentially independent from one another and, therefore, can differ from each other. Sensor unit 110 and control unit 160 are communicatively coupled to each other. Coupling at the isolation barrier is provided by an interface 150.

In some implementations, sensor unit 110 comprises a transducer 112, an input stage 114 and a Sigma-Delta modulator 116. Transducer 112 is coupled, via a signal line 113, to input stage 114. Further, input stage 114 is coupled, via a signal line 115, to Sigma-Delta modulator 116. Transducer 112 is configured to sense, i.e. to detect, a physical quantity, for example a phase current, and to provide a corresponding output as an analog sense signal AS on signal line 113 to input stage 114. Input stage 114 is configured to amplify and otherwise process the analog sense signal as needed, for example by filtering noise from the analog sense signal, and to output a processed analog sense signal PAS on signal line 115 to Sigma-Delta modulator 116. Sigma-Delta modulator 116 is configured to form, based on the processed analog sense signal, a digital sense signal DS and to output the digital sense signal to a signal output port 117 of sensor unit 110. In some implementations, the number of zeros and ones provided in the serial data bit representation of the digital sense signal DS during a predetermined time interval represents a level of the analog sense signal AS. Sensor unit 110 comprises a control input port 119 configured to receive a control signal. In some implementations, Sigma-Delta modulator 116 is coupled to control input port 119 and configured, for example, to use a clock signal CLK received at control input port 119 when forming the digital sense signal DS.

In some embodiments according to concepts disclosed herein, sensor unit 110 comprises a clock demodulator 122 that is coupled to control input port 119. In some implementations coupling of control input port 119 to clock demodulator 122 is provided by a clock signal line 121. Clock demodulator 122 is configured to demodulate or otherwise decode a signal received from control input port 119 so as to extract encoded information from the signal, and to output a control signal CTRL that represents this extracted information.

In some embodiments, sensor unit 110 comprises a communication interface 124 that is coupled to demodulator 122, for example, via a control signal line 123, and configured to receive the control signal CTRL from clock demodulator 122. In some implementations, communication interface 124 is configured to extract control information such as instructions, parameter settings, address data and the like from control signal CTRL. In some embodiments, communication interface 124 is coupled, for example by a control signal line 125, to an input and modulator configuration module 126 that, in some embodiments, is coupled to at least one of the components transducer 112, input stage 114 via line 127 and SD modulator 116 via line 128, and configured to provide configuration information such as settings information to the respective component. In some embodiments, communication interface 124 is coupled, for example by a control signal line 129, to a sensor unit configuration and control module 130 configured, for example, to configure sensor unit 110 and/or other devices. Speaking more generally, the sensor unit configuration and control module 130 can also be referred to as a device configuration and control module, since other devices than sensor unit 110 can also be configured and/or controlled according to the techniques disclosed herein by using the device configuration control module 130. It should be understood that the input and modulator configuration module 126 and the sensor unit configuration and control module 130 are discussed herein as separate entities merely for the sake of providing an example. However, the skilled person can co-locate these entities or provide one as part of the other. Communication interface 124 is configured to communicate control information to input and modulator configuration module 126 and/or to sensor unit configuration and control module 130 in accordance with the function assigned to the respective module within sensor unit 110. Thus, communication interface 124 can provide settings information, commands and/or other control signals to at least one of input and modulator configuration module 126 and sensor unit configuration and control module 130.

Now, still referring to FIG. 1, control unit 160 comprises a signal input port 169, a Sigma-Delta demodulator 166 and a processing unit. In some embodiments the processing unit is provided as a data processing unit 162. Signal input port 169 is coupled by a serial input line 168 to Sigma-Delta demodulator 166. Sigma-Delta demodulator 166 is coupled, via a parallel bus 163 to processing unit 162. Sigma-Delta demodulator 166 is configured to obtain the digital sense signal DS received at signal input port 168 and to demodulate the serial data stream of the digital sense signal DS for output of sense data in a parallel data signal PDS onto bus 163 to processing unit 162. Sigma-Delta demodulator 166 comprises a decimation filter that is configured to change a data format from a serial data stream to a parallel data word. In some embodiments the decimation filter forms part of a configuration to perform oversampling. At least one effect can be that to improve a resolution of the digital representation of the analog sense signal and/or to reduce undesired effects in the digital representation of the analog sense signal, such as noise and aliasing. In some implementations, Sigma-Delta demodulator 166 is configured to output parallel 8 bit data word representations of the digital sense data. The example of 8 bit is chosen merely to state an example. The skilled person could contemplate any other number of bits to be used in the parallel bit representation, e.g., 10 bit, 16 bit, 24 bit, 32 bit, and so forth, without departure from the concept. Further, it should be understood that, typically, upon starting operation of Sigma-Delta demodulator 166 in an initial state, and/or upon beginning to feed a non-zero digital sense signal DS to Sigma-Delta demodulator 166, for example when performing a wakeup, time is needed in order to settle Sigma-Delta demodulator 166 such that parallel data output by Sigma-Delta demodulator 166 correspond to a serial stream of sense data provided to Sigma-Delta demodulator 166. In some implementations, the interval required for settling Sigma-Delta demodulator 166 expressed in clock cycles of the clock used with Sigma-Delta analog-to-digital converter can be as long as a product of an order of Sigma-Delta demodulator 166 times an oversampling ratio.

As described above, in some implementations, sensor unit 110 and control unit 160 are electrically separated by an isolation barrier that separates respective domains of ground potential from one another, i.e., that separates the measurement ground potential from the controller ground potential. In some embodiments, in order to enable communication across the isolation barrier, interface 150 is configured to communicatively couple sensor unit 110 to control unit 160. In some implementations, interface 150 comprises optical coupling elements such as opto-couplers. In some implementations, interface 150 comprises capacitive coupling elements. In some implementations, interface 150 comprises magnetic coupling elements such as coreless magnetic couplers sometimes also briefly referred to as CT couplers. In an alternate embodiment, the isolation barrier is incomplete. In such an embodiment the measurement ground potential and the controller ground potential are not completely separated but rather are offset from one another by an offset voltage that may vary within a predetermined range. Some embodiments comprise transistor circuitry to implement level shifters configured to provide communicative coupling.

Control unit 160 comprises a clock generator 173 configured to generate or otherwise provide a clock signal CLK for use in operation of at least some of the above-described components of measurement system 100. In some implementations, clock generator 173 is configured to provide the clock signal CLK so as to comprise a sequence of periodic changes of signal voltage, alternately from a high voltage level to a low voltage level, and vice versa, thus alternately providing a rising clock signal edge and falling clock signal edge. In some implementations the above-described components are configured to use either rising edges or falling edges in the clock signal to define a clock cycle as needed in the respective component's operation.

Control unit 160 comprises a clock modulator 175 that is coupled, via a clock signal line 174, to a clock generator 173. Clock modulator 175 is coupled, via a clock signal line 176, to control output port 167. In some embodiments clock modulator 175 is also coupled, for example, via SD modulator 166, to processing unit 162. Clock modulator 175 is configured to modulate a clock signal CLK received from clock generator 174 so as to provide a modulated clock signal mCLK to control output port 167 and/or to processing unit 162. Clock modulator 175 is configured to modulate the sensor unit control data onto the clock signal so as to obtain a modulated clock signal mCLK that carries both, the clock signal and the sensor unit control data.

In an aspect according to some embodiments, processing unit 162 is configured to provide sensor unit control data to clock modulator 175. More particularly, in some embodiments processing unit 162 is coupled, via a control signal line 161, to a communication interface 171. In some embodiments, control signal line 161 is provided by a communication bus. In some implementations, communication interface 171 is configured to support a standardized communications protocol. For example, in some implementations, communication interface 171 is configured to support a Universal Asynchronous Receiver Transmitter (UART) communications protocol. Accordingly, in some embodiments, communication interface 171 is configured to represent data in bit sequences comprised in frames of a fixed length. In some implementations, each frame comprises a start bit (SOF), a plurality of data bits, in some implementations in a range of from five to nine data bits, and an optional parity bit, and a stop bit (STOP). At least one effect can be that, while no clock signal needs to be transferred (UART communication is asynchronous), in some embodiments a timing of the communication according to UART is based on a clock frequency of the clock signal CLK. At least one effect can be that a fixed timing relation between a sending communication interface, i.e., communication interface 171, and a recipient communication interface, e.g., in some embodiments that will be described in more detail below, communication interface 124 provided in sensor unit 110, can be established. It should be understood that the UART protocol is stated as an example; the skilled person can contemplate use of another communication protocol, including use of a protocol that is specifically designed with a view to its use in a measurement system.

Communication interface 171 is coupled, via a clock control line 172, to clock modulator 175. In some implementations, communication interface 171 is configured to receive a control data signal CD from processing unit 162. In some embodiments, processing unit 162 is configured to control, for example by using communication interface 171, operation of clock modulator 175, for example, to set a frequency of the modulated clock signal mCLK or to set a duty cycle of the modulated clock signal mCLK. In some embodiments while one edge (rising or falling) in the modulated clock signal mCLK is used to encode the clock information, the other edge (falling or rising) in the modulated clock signal mCLK can be used to encode other information, in particular control information such as a parameter value to be set as configuration of the sensor unit 110 and/or control commands.

Now, coupling between sensor unit 110 and control unit 160 is described in more detail. In some embodiments, coupling of signal output port 117 of sensor unit 110 via interface 150 to signal input port 169 of control unit 160 is provided by a digital signal line 151 between sensor unit 110 and interface 150 and by a digital signal line 152 between interface 150 and input port 169 of control unit 160. Further, in some embodiments, coupling of control output port 167 of control unit 160 to control input port 119 of sensor unit 110 via interface 150 is provided by a control signal line 156 between control unit 160 and interface 150 and by a control signal line 157 between interface 150 and sensor unit 110.

Given the above-described coupling between sensor unit 110 and control unit 160, Sigma-Delta modulator 116 and Sigma-Delta demodulator 166, in some embodiments, are configured to co-operate as an analog-to-digital converter to convert the analog sense signal AS into the parallel digital sense signal PDS as a parallel data bit representation of sense information carried by the analog sense signal.

The exemplary measurement system can be configured for use, for example, to perform phase current measurements, such as in an electric drive system, in a smart meter application, or in a switched mode power supply (SMPS). It should be understood that the example of phase current as a quantity to be measured is merely stated for the purpose illustration. Measurement system 100, in particular using a suitable transducer, is not limited to be configured to measure phase current, but can be configured to measure any other physical quantity as needed, for example direct electrical current, static charge, voltage, pressure, acceleration, and the like.

Exemplary embodiments of clocking that can be implemented, for example in embodiments described above with reference to FIG. 1, will now be described.

Figure 2:
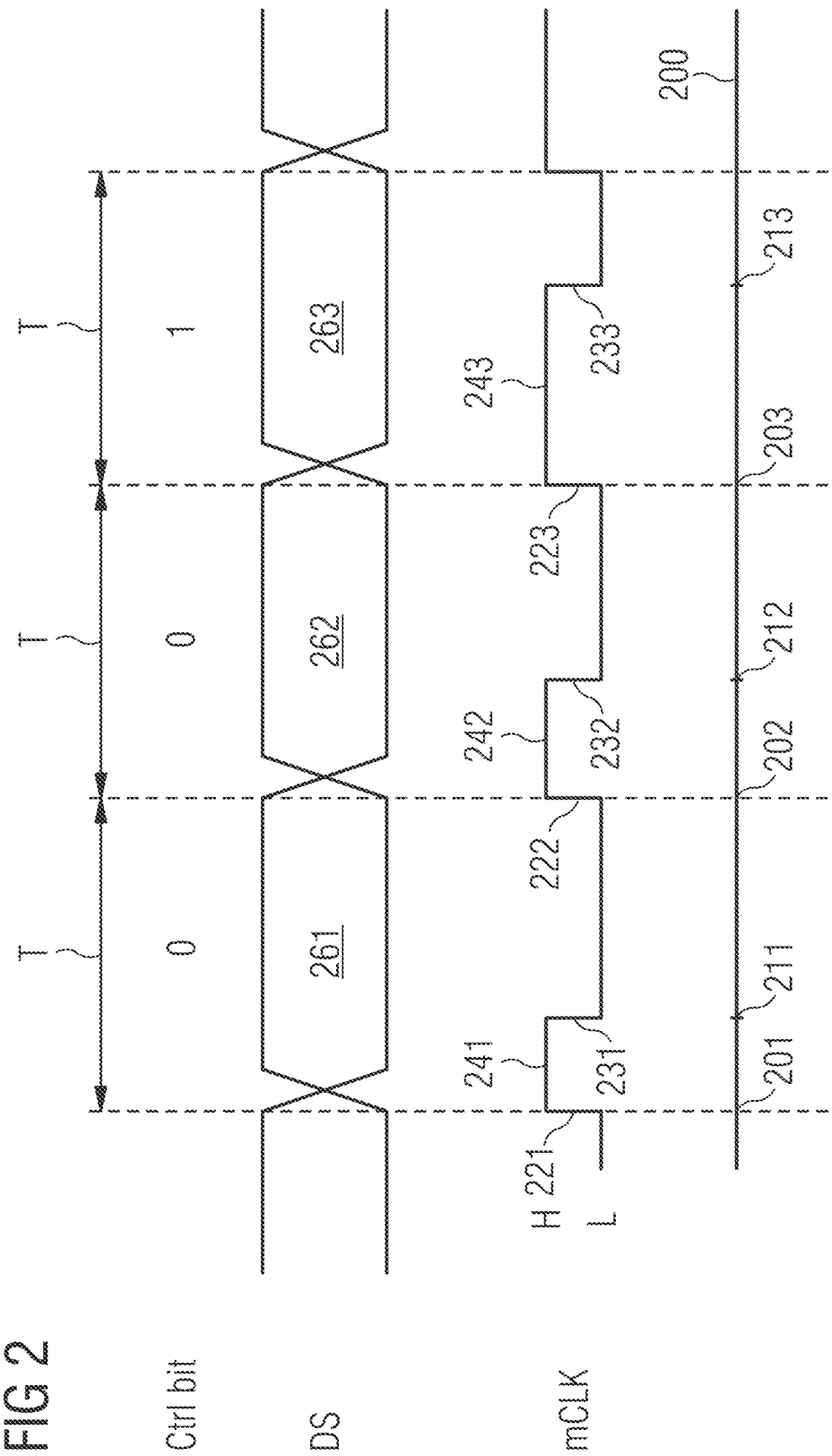
FIG. 2 illustrates a time line of signals according to some implementations.

FIG. 2 illustrates a time line 200 of a modulated clock signal according to some implementations, as shown, for example, in FIG. 1, where SD clock modulator 175 is configured to modulate the clock signal by varying a duty cycle of the clock signal. As an example, FIG. 2 depicts a case where clock SD clock modulator 175 receives a sequence of zeros and ones (in the example 001), i.e., a binary representation of the sensor unit control data from communication interface 171 that, in turn, received a corresponding bit word from processing unit 162. In some implementations, as shown in FIG. 2, a zero is modulated onto the clock signal by a short duty cycle and a one is modulated onto the clock signal by a long duty cycle. In FIG. 2, a short duty cycle is one third while a long duty cycle is two thirds. For another example, a short duty cycle may be 30 percent while a long duty cycle may be 70 percent. For a further example, a short duty cycle may be 40 percent while a long duty cycle may be 60 percent. Other values can also be contemplated; in particular, asymmetric implementations can be contemplated such as a short duty cycle of 30 percent and a long duty cycle of 50 percent. The skilled person will select duty cycle percentages that, in a given implementation, can be discriminated from one another so as to enable the sensor unit to decode zeros and ones in the modulated clock signal mCLK. While the embodiments described herein use a binary representation of control data by implementing the modulation with two different duty cycles, it should be understood that implementations can be devised that use more than two different duty cycles such as three duty cycle, e.g. 25 percent, 50 percent and 75 percent, in order to encode the control data to be carried by the clock signal.

Now, looking more closely at the example shown in FIG. 2, at times 201, 202 and 203, rising edges 221, 222 and 223 in modulated clock signal mCLK define a beginning of a corresponding clock pulse, respectively, in modulated clock signal mCLK. It should be understood that, instead of a rising edge to define a clock pulse beginning, a falling edges could be used just as well. A duration T of each clock cycle is the same. At times 211, 212 and 213, falling edges 231, 232 and 233 in modulated clock signal mCLK end intervals 241, 242 and 243 of the modulated clock signal mCLK in the high level and thus define the respective duty cycle as the intervals 241, 242 and 243 of the modulated clock signal mCLK with the high level as a portion of a total pulse length T. Thus, falling edges 231, 232 and 233 define the coded bit values 0, 0 and 1, respectively, that are modulated onto clock signal CLK. It should be understood that, instead of defining the represented bit to be zero, when the duty cycle of the modulated clock signal is small, and to be one, if the duty cycle of the modulated clock signal is large, the assignment of represented bit could also be defined vice versa.

Figure 3:
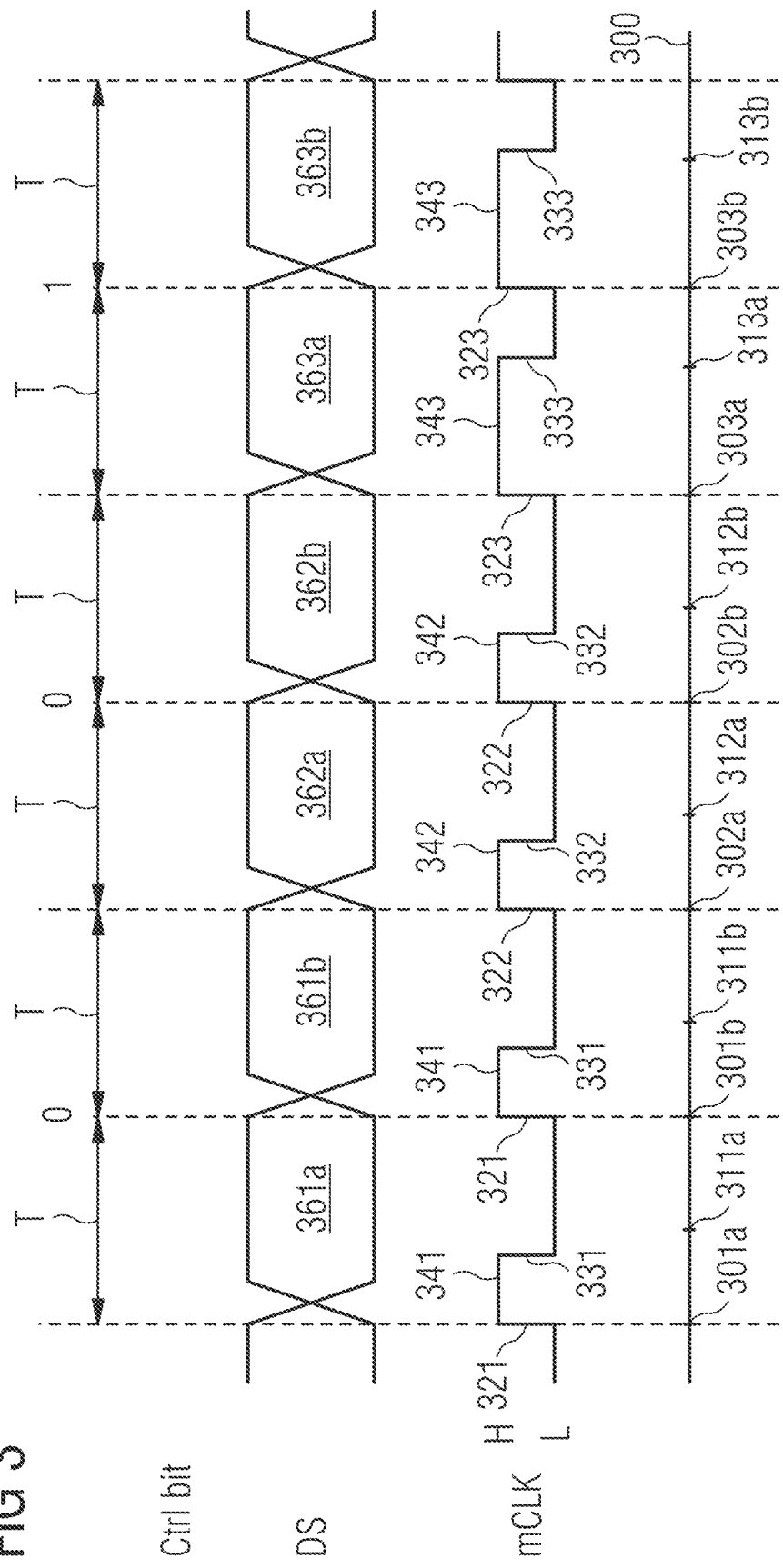
FIG. 3 illustrates a time line of signals according to some implementations.

FIG. 3 illustrates a time line 300 of a modulated clock signal according to some alternate implementations that are similar to the example shown in FIG. 2. In the implementations with the timeline illustrated in FIG. 3, SD clock modulator 175 is configured to modulate the clock signal by varying a duty cycle of the clock signal. In the example of FIG. 3, like in the example of FIG. 2, SD clock modulator 175 receives, from communication interface 171, a sequence of zeros and ones (in the example 001). Further, in the example, a zero is modulated onto the clock signal by a short duty cycle and a one is modulated onto the clock signal by a long duty cycle. Like in the example of FIG. 2, also in the example of FIG. 3 a short duty cycle is one third while a long duty cycle is two thirds. The person skilled in the art may contemplate other ratios as explained above with reference to FIG. 2. In FIG. 3, at times 301 (301a and 301b), 302 (302a and 302b) and 303 (303a and 303b), rising edges 321, 322 and 323 in modulated clock signal mCLK define a beginning of a corresponding clock cycle 361, 362 and 363, respectively, in clock signal CLK. At times 311 (311a and 311b), 312 (312a and 312b) and 313 (312a and 313b), falling edges 331, 332 and 333 in modulated clock signal mCLK end intervals 341, 342 and 343 of the modulated clock signal mCLK in the high level and thus define the respective duty cycle as the intervals 341, 342 and 343 of the modulated clock signal mCLK in the high level as a portion of a total duty cycle length. Thus, falling edges 331, 332 and 333 define the coded bit values 0, 0 and 1, respectively, that are modulated onto clock signal CLK. However, the implementation illustrated in FIG. 3 differs from the implementation illustrated in FIG. 2 in that each duty cycle is transmitted in a succession of more than one clock cycle of length T, from communication interface 171. For the purpose of a simple exemplary illustration, FIG. 3 depicts an implementation where a duty cycle is transmitted in two successive clock cycles providing, for example, the illustrated sequence of clock cycles 361a, 361b, 362a, 362b, 363a and 363b. However, other implementations may define the duty cycle to encompass a larger number of clock cycles such as three, four, or more. Since two successive clock cycles are used to transmit the duty cycle information in the modulated clock signal mCLK, the recipient, for example sensor unit 110, can base its decoding of the modulated clock signal on an integrated duty cycle or on an average duty cycle whereby the decoding can be more accurate than in the case depicted in FIG. 2 where the duty cycle is based on one clock cycle in the modulated clock signal mCLK. At least one effect can be an increased resistance to noise and/or to other effects that adversely affect communication.

Using the control signal encoding to provide modulated clock signal mCLK to sensor unit 110, control unit 160 can thus provide commands such as power down, power up, reset, and so forth to sensor unit 110. At least one effect can be that control unit 160 enables sensor unit 110 to use power efficiently and to operate only to the extent needed in measurement system 100. Using modulated clock signal mCLK, control unit 160 can also be configured to communicate to sensor unit 110 other information such as gain and offset range settings of input stage 114. In yet further embodiments, using the modulated clock signal mCLK, control unit 160 can communicate timing information to be used in an operation of filters such as low pass filters that are implemented in input stage 114. In still other embodiments, using the modulated clock signal mCLK, control unit 160 can configure or otherwise set an output driver (not shown in FIG. 1) implemented in sensor unit 110 so as to output the digital sense signal DS 261, 262, 263 at a desired power level at signal output port 117.

Further, control unit 160 may be configured to encode address data in modulated clock signal mCLK so as to selectively address one sensor unit 110 in a plurality of sensor units, if more than one sensor unit 110 is comprised in measurement system 100. At least one effect can be that control of one or more sensor units 110 tied to a measurement ground potential that is essentially independent from a controller ground potential can be performed while avoiding an additional control signal line to be interfaced across the barrier between the controller ground potential and the measurement ground potential. Thereby, significant efficiencies can be made and, consequently, the techniques described herein can be implemented in many more applications than conventional solutions that require the clock signal line to only be used for a transmission of the clock signal but not for a transmission of other information such as control information or control commands.

In some implementations, data received at sensor unit 110 can be used as a control data word or as a configuration data word, whereby a synchronization of an updated configuration of the sensor unit's SD modulator 116 to a configuration of the control unit's SD demodulator 166 is achieved. The update may have been performed according to a predetermined update schedule or at the request of control unit 160. In some embodiments, control unit 160 is configured to dismiss data received by the digital sense signal DS during a predetermined interval after transmission of a configuration request or transmission of a synchronization request. In some implementations, a configuration operation and/or a synchronization of a configuration of sensor unit 110 may keep sensor unit 110 from forming the digital sense signal to carry an accurate representation of the physical quantity to be detected. For example, a configuration operation may require sensor unit 110 to establish a predetermined input stage gain, which may need some time to settle. For another example, a configuration operation may require sensor unit's SD modulator 116 to settle before being able to output any meaningful digital signal. If control unit 160 is configured to count off a predetermined number of clock cycles after transmission of a request before accepting the digital sense signal DS as a representation of measurement data, at least one effect can be to avoid processing of corrupted or other inaccurate data that do not reflect any physical quantity's value.

In some embodiments, sensor unit 110 is configured, as will be described in more detail below, to provide a first type digital signal DS1 and a second type digital signal DS2. The first type digital signal DS1 can be formed to represent status data and/or low resolution measurement data, herein collectively also referred to as other data, while the second type digital signal DS2 can be formed to represent high resolution measurement data. In some implementations, sensor unit 110 is configured to form the first type data signal DS1 during startup, when configuring, and/or when synchronizing SD modulator 116, for example, to SD demodulator 166. In some implementations sensor unit 110 can be configured to form the second type digital data signal upon completion of the afore-stated operations. At least one effect can be to provide to control unit 160, already at an early stage, e.g., still during settling of SD modulator 116, an indication as to a status of sensor unit 110 or as to an existence of a physical quantity about to be measured, before sensor unit 110 transmits, using the second type digital sense signal DS2, any higher resolution measurement data. As used herein, status information encompasses settings information. In some embodiments, error information, e.g., resulting from a self-check of the sensor unit, and the like can form a basis for determining a plausibility of other data such as serial data provided in the digital sense signal DS. In some implementations, the status information is indicative of a connection, e.g., between sensor unit 110 and control unit 160.

In some embodiments, control unit 160 is configured, as will be described in more detail below, to interpret the digital sense signal DS in order to determine, if the signal represents data to be processed or not. In some embodiments, the determining includes an interpretation as to what kind of data the digital sense signal DS represents. At least one effect can be that control unit 160 can adapt processing of the data according to a result of the determining.

Figure 4:
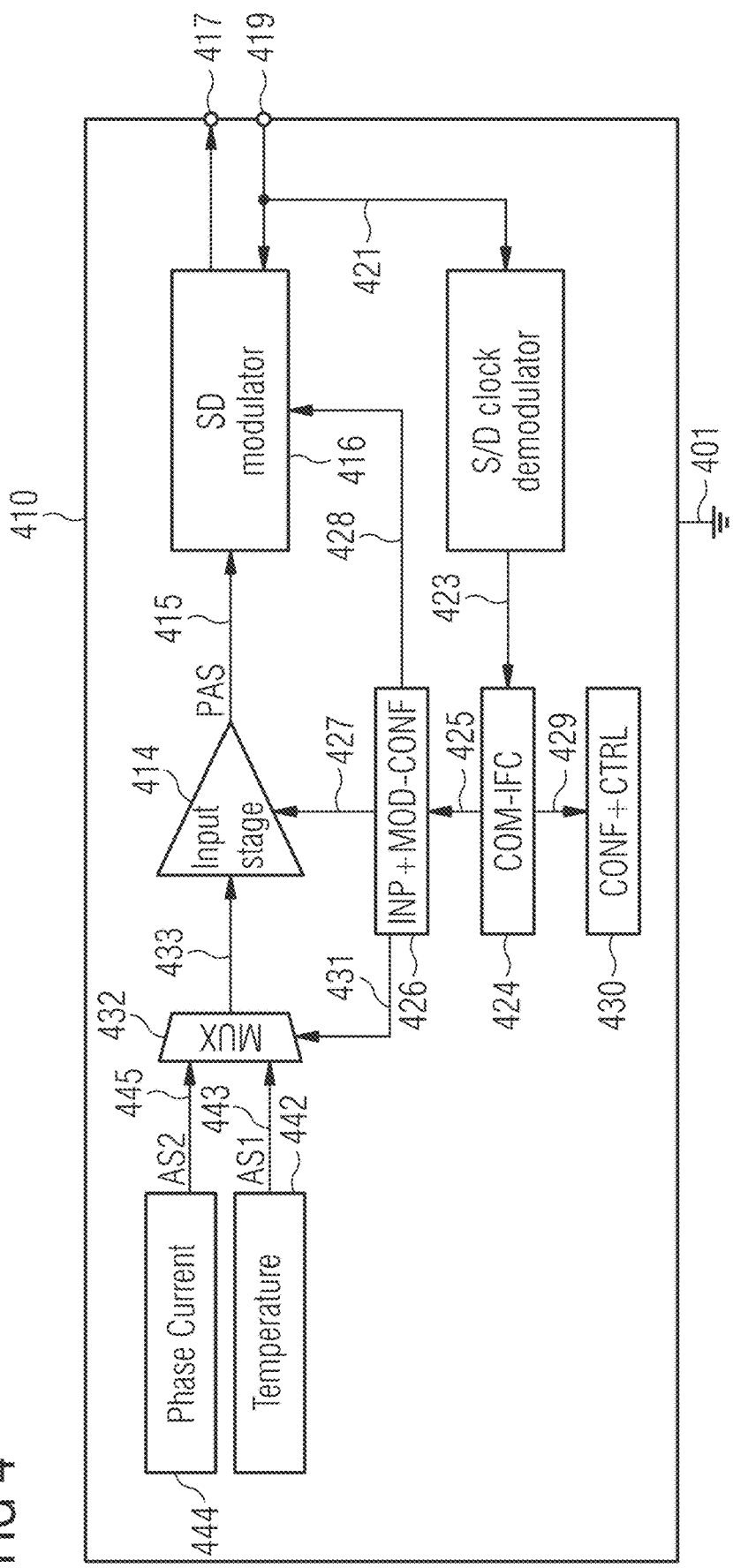
FIG. 4 illustrates a block diagram of a sensor unit according to some embodiments.

FIG. 4 illustrates a block diagram of a sensor unit 410 according to some embodiments according to some alternate embodiments. Sensor unit 410 comprises components of sensor unit 110 described above with reference to FIG. 1, with reference numerals 415, 416, 417, 419, 421, 423, 424, 425, 427, 428, 429, 430 corresponding to reference numerals 115, 116, 117, 119, 121, 123, 124, 125, 127, 128, 129, 130, respectively. Further, as illustrated in FIG. 4, sensor unit 410 is configured to selectively detect a variety of physical quantities, namely phase current and temperature. To this end, sensor unit 410, in some embodiments, comprises a first transducer 442, a second transducer 444, and a multiplexer 432 coupled, via an analog signal line 433, to an input stage 414 that essentially corresponds to input stage 114 in sensor unit 110 illustrated in FIG. 1. While for the purpose of illustration multiplexer 432 and input stage 414 are described herein separately, it should be understood that multiplexer 432 can be co-located with input stage 414 and/or form part of input stage 414.

First transducer 442 is configured to generate an analog electrical signal AS1 that carries temperature information, herein also referred to as analog temperature signal. In some embodiments the temperature information is an ambient temperature value that reflects the temperature at the location of a first transducer sensor element (not shown in FIG.

4). First transducer 442 is coupled to multiplexer 432 by an analog signal line 443 and configured to output the analog temperature signal AS1 to multiplexer 432.

Second transducer 444 is configured to generate an analog electrical signal AS2 that carries phase current information, herein also referred to as analog phase current signal. In some embodiments the transducer sensor element comprises a shunt resistor (not shown in FIG. 4) and phase current information is a voltage value that reflects the phase current flowing through the shunt resistor. Second transducer 444 is coupled to multiplexer 432 by an analog signal line 445 and configured to output the analog phase current signal AS2 to multiplexer 432.

In some embodiments, multiplexer 432 is coupled, via a select signal line 431, to an input and modulator configuration module 426 and configured to receive, from input and modulator configuration module 426, a configuration signal carrying configuration information from configuration module 426. In particular, where the configuration information is a selection information, multiplexer 432 is configured to select one of analog temperature signal AS1 or analog phase current signal AS2 to be fed to input stage 414. Using the sensor unit 410 in measurement system 100 instead of sensor unit 110, i.e., if sensor unit 410 is coupled to control unit 160, the modulated clock signal mCLK can be used to select in sensor unit 410 which physical quantity should presently be detected.

Figure 5:
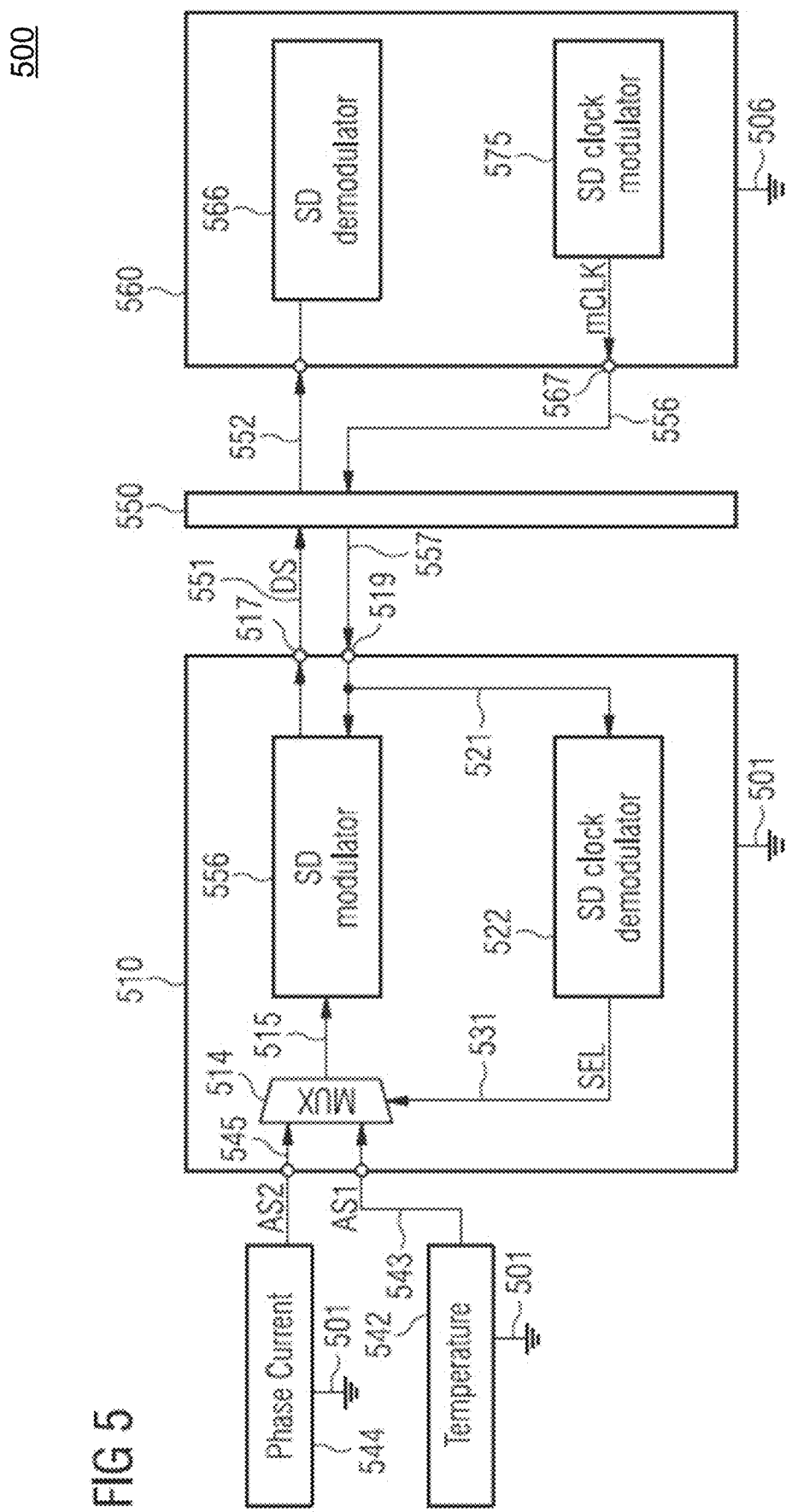
FIG. 5 illustrates a block diagram of a measurement system according to some embodiments.

FIG. 5 illustrates a block diagram of a measurement system 500 that comprises sensor elements 542, 544, a sensor unit 510 that is coupled to the sensor elements 542, 544, and a control unit 560 coupled to the sensor unit 510. Many of the components illustrated in FIG. 5 resemble corresponding ones shown in measurement system 100 illustrated in FIG. 1. In particular, in some implementations, an interface 550 may be coupled between the sensor unit 510 and the control unit 560. At least one effect can be that, as described above, while an isolation barrier can be provided at the interface 550 to securely separate a first ground potential at sensor elements 542, 544 and/or sensor unit 510 from a second ground potential at control unit 560, interface 550 can enable communication between sensor unit 510 and control unit 560. While communication interface 550 is located at the isolation barrier between sensor ground potential 501 and controller ground potential 506, respectively, it should be understood that no communication interface may be provided in some embodiments where sensor ground potential and controller ground potential are the same such that a direct connection between sensor unit 510 and 560 is sufficient. Further, while the system in FIG. 5 shows sensor elements 542, 544 external to sensor unit 510, it should be understood that one or more of sensor elements 542, 544 in some implementations form part of sensor unit 510 (see, for example, FIG. 4).

According to some embodiments, measurement system 500 is adapted to use a frequency-modulated clock signal in order to communicate control information from control unit 560 to sensor unit 510. In some embodiments, first sensor element 542 is configured as a temperature-sensitive transducer that is configured to output an analog electrical signal AS1 that represents an ambient temperature (herein the signal is also referred to as analog temperature signal). In some embodiments, second sensor element 544 is configured as a transducer sensitive to phase current. The transducer of second sensor element 544 is configured to output an analog electrical signal AS2 that represents a nearby phase current (herein the signal is also referred to as analog phase current signal).

Measurement system 500 is configured, using analog signal lines 543 and 545, to feed the analog temperature signal AS1 and the analog phase current signal AS2 to a multiplexer 514 provided in sensor unit 510 Multiplexer 514 is configured to selectively output, via an analog signal line 515, one of the analog temperature signal AS1 and the analog phase current signal AS2 to a Sigma-Delta modulator (SD modulator) 556. SD modulator 556 is configured to provide a digital sense signal DS 551 to an output port 517 of sensor unit 510.

In some implementations, sensor unit 510 is configured to receive, at a control input port 519 over line 557, a frequency-modulated clock signal mCLK. Sigma-Delta modulator 516 is coupled to control input port 519 and configured to use the frequency-modulated clock signal mCLK when forming the digital sense signal DS. Further, sensor unit 510 comprises a clock demodulator 522 that is coupled to control input port 519. Coupling of control input port 519 to clock demodulator 522 is provided, for example, by a clock signal line 521. Clock demodulator 522 is configured to demodulate or otherwise decode the frequency-modulated clock signal received from control input port 519 so as to extract encoded select information from the signal. In some embodiments, clock demodulator 522 is configured to discriminate different frequencies used in the frequency-modulated clock signal mCLK. In some embodiments, clock demodulator 522 is configured to assign a select-bit value of either one or zero, if a frequency of the frequency-modulated clock signal is high or low, respectively. In some implementations, clock demodulator 522 is configured to output, via a select signal line 531, to multiplexer 514 a select signal SEL that represents the extracted select information such as the select-bit. Multiplexer 514 is configured to select, according to the select information, one of analog temperature signal AS1 and analog phase current signal AS2 to be output to SD modulator 556.

Now, still referring to FIG. 5, control unit 560 comprises a Sigma-Delta demodulator (SD demodulator) 566 and an SD clock modulator 575. In some embodiments SD demodulator 566 is provided like SD modulator 166 described above with reference to FIG. 1. In particular, SD demodulator 566 is configured to obtain the digital sense signal DS over line 552 and to demodulate a serial data stream of the digital sense signal DS for output, for example, to a processing unit (not shown in FIG. 5).

In some embodiments, clock modulator 575 is coupled to a clock generator (not shown in FIG. 5), to a control output port 567, and/or to the processing unit. Clock modulator 575 is configured to frequency-modulate a clock signal CLK received from the clock generator so as to provide a frequency-modulated clock signal mCLK to the control output port 567. Clock modulator 575 is configured to frequency-modulate the sensor unit control data onto the clock signal so as to obtain a modulated clock signal mCLK that carries both, the clock signal and the sensor unit control data. In some embodiments, clock modulator 575 comprises a frequency divider that can be selectively used for clock modulator 575 to output, for example, a high frequency clock signal and a low frequency clock signal. In some implementations, the high frequency clock signal, for example, has a frequency in a range of from 10 to 20 MHz. In contrast, in some embodiments, the low frequency clock signal has a frequency in a range of from 1 to 5 MHz. In some embodiments a frequency value is selected suitable for direct use in operation of the sensor unit's SD modulator 556. For example, where the frequency of the modulated clock signal is in the range from 10 to 20 MHz, a fast analog-to-digital conversion rate of an analog sense signal can be achieved with a high resolution such as with a digital signal resolution in a range from 12 to 14 bit.

Exemplary Configurations with Multiple Data Type Transmission

Figure 6:
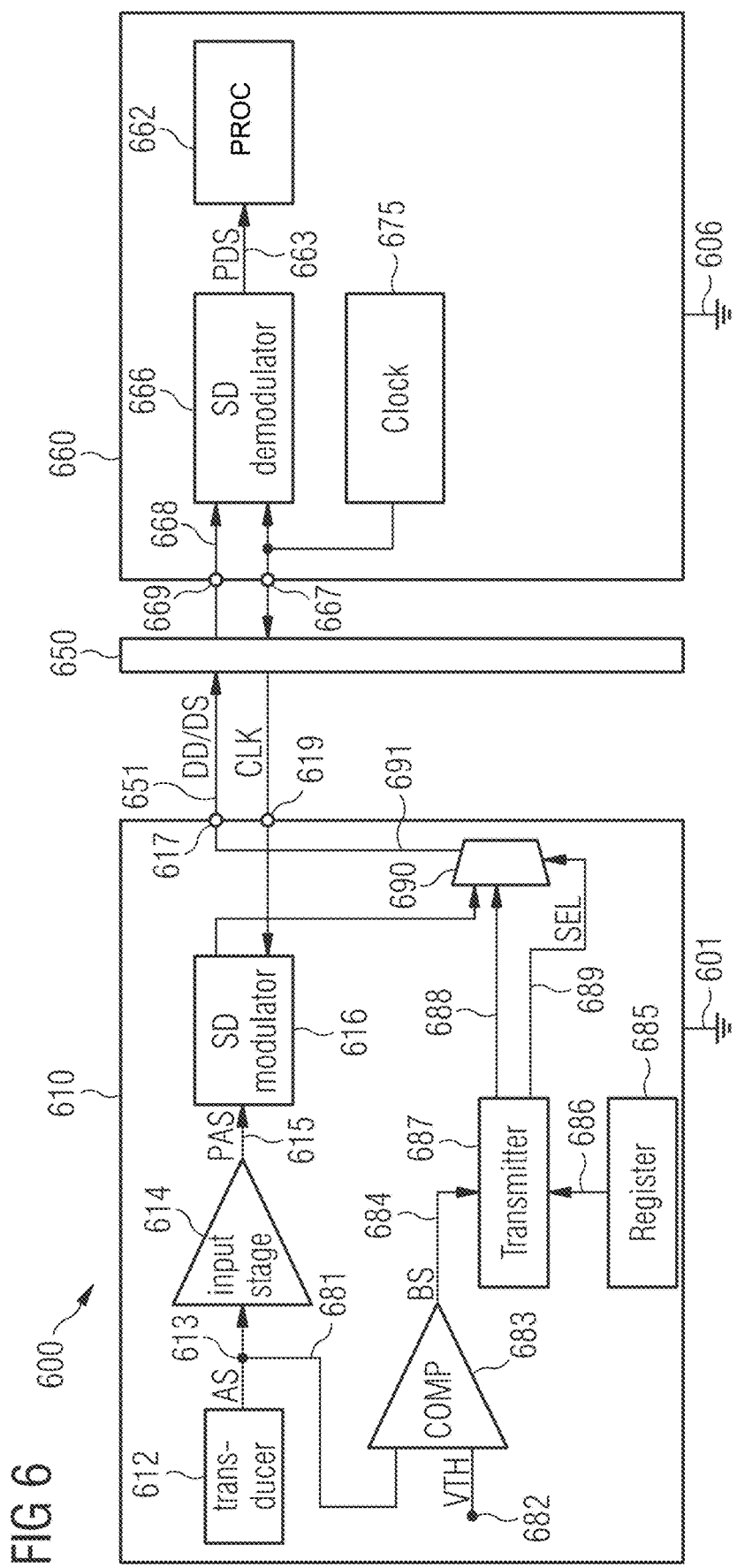
FIG. 6 illustrates a block diagram of a measurement system according to some embodiments.

FIG. 6 illustrates a block diagram of a measurement system 600 according to some embodiments. As embodiments of measurement system 600 comprise some or all components of the measurement system described above with reference to FIG. 1, merely some of the components will now be described while it should be understood that other components described above can also be provided. In particular, measurement system 600 comprises a sensor unit 610 and a control unit 660. Sensor unit 610 and control unit 660 are electrically separated from each other by an isolation barrier. In particular, sensor unit 610 is coupled to a first ground 601 that defines a measurement or sensor ground potential, while control unit 660 is coupled to a second ground 606 that defines a controller ground potential. The measurement ground potential at first ground 601 and the controller ground potential at second ground 606 are essentially independent from one another and, therefore, can differ from each other. Sensor unit 610 and control unit 660 are communicatively coupled to each other. Coupling at the isolation barrier is provided by an interface 650.

In some implementations, sensor unit 610 comprises a transducer 612, an input stage 614 and a Sigma-Delta modulator 616. Sigma-Delta modulator 616 is coupled to a signal output port 617 of sensor unit 610. Transducer 612 is coupled, via a signal line 613, to input stage 614. Further, input stage 614 is coupled, via a signal line 615, to Sigma-Delta modulator 616. Transducer 612 is configured to sense a physical quantity, for example a phase current, and to provide a corresponding output as an analog sense signal AS on signal line 613 to input stage 614. Input stage 614 is configured to amplify and otherwise process the analog sense signal, and to output a processed analog sense signal PAS on signal line 615 to Sigma-Delta modulator 616. Sigma-Delta modulator 616 is configured to form, based on the processed analog sense signal, a digital sense signal DS and to output the digital sense signal to the signal output port 617 of sensor unit 610 for output over line 651.

Sensor unit 610 comprises a control input port 619 configured to receive a control signal. In some implementations, Sigma-Delta modulator 616 is coupled to control input port 619 and configured, for example, to use a clock signal CLK received at control input port 619 when forming the digital sense signal DS. In some embodiments (not shown in FIG. 6) disclosed herein, sensor unit 610 comprises a clock demodulator that is coupled to control input port 619. In some implementations coupling of control input port 619 to the clock demodulator is provided by a clock signal line. The clock demodulator is configured to demodulate or otherwise decode a signal received from control input port 619 so as to extract encoded information from the signal, and to output a control signal CTRL that represents this extracted information.

In some embodiments, sensor unit 610 comprises a comparator 683 that has a sense input terminal coupled, for example, via an analog signal line 681, to transducer 612, and that has a reference input terminal coupled to a threshold voltage terminal 682 that is set to a threshold voltage VTH. Further, in some embodiments, comparator 683 is coupled, for example via a bit signal line 684, to a transmitter 687. Comparator 683 is configured to compare an analog sense signal AS to the threshold voltage VTH and to output a bit signal BS indicative of a comparison result on bit signal line 684 to transmitter 687.

In some implementations, sensor unit 610 comprises a status circuit portion 685 that is coupled, for example via a data line 686, to transmitter 687. In some embodiments, status circuit portion 685 is configured, for example as a register, to store status data indicative of a sensor unit's status and to output some or all data to transmitter 687.

In some embodiments, coupled between Sigma-Delta modulator 616 and signal output port 617, a selector 690 is arranged so as to receive the digital sense signal DS from Sigma-Delta modulator 616. In some implementations, transmitter 687 is coupled, for example via data line 688, to selector 690. In some embodiments, transmitter 687 is further coupled, via a select signal line 689, to selector 690. An output terminal of selector 690 is coupled, for example by a digital signal line 691, to output port 617.

Transmitter 687 can be configured to transmit data received from status circuit portion 685 to selector 690. Transmitter 687 can be configured to transmit a select signal SEL to selector 690. In some embodiments, transmitter 687 is configured to base the transmitting of status data and/or of the select signal SEL on the bit signal BS received from comparator 683. At least one effect can be that, by implication, the transmitting the status data, at a recipient, can also provide information about the bit signal BS, if the recipient knows, how transmitter 687 decided on the basis of the bit signal BS received from comparator 683, if to transmit the status data.

In some implementations, for example, if the bit signal BS indicates that a level of the analog sense signal AS is equal to or above a level of the threshold voltage VTH, then transmitter 687 issues a select data signal SEL to selector 689 in order to select data received from status circuit portion 685 for transmission to control unit 660. In contrast, if the bit signal BS indicates that the level of analog sense signal AS is below the level of the threshold voltage, transmitter 687 issues the select data signal SEL to request a selection of the digital sense signal DS for transmission to control unit 660. At least one effect can be to avoid, where a signal strength below the threshold voltage implies invalidity, transmission of an invalid sense signal to control unit 660. The skilled person can contemplate other criteria of validity such as too high a voltage or signal strength and, accordingly, can implement a maximum voltage that the analog sense signal must not exceed, if the digital sense signal should be considered valid for transmission to control unit 660. A further effect can be to improve a use of time: When, at sensor unit 610, no valid sense signal is available for transmission to control unit 660, sensor unit 610 can, instead of transmitting the invalid sense signal, transmit information about the sensor unit's status to control unit 660. Where the threshold voltage VTH is set appropriately, still a further effect can be that, based on an output of comparator 683, a rough sensed value of a physical quantity can be provided by comparator 683 early on, i.e., even while Sigma-Delta modulator 616 may not be operational, for example, during an initialization at startup or at wakeup of sensor unit 610.

Selector 690 is configured to selectively forward the digital sense signal DS to output port 617 as will be described in more detail below. In some embodiments, selector 690 is configured to selectively forward to output port 617 the digital sense signal received from SD modulator 616 or the status signal received from transmitter 687. In some embodiments, the status data signal can comprise, for example, settings information, commands and/or other control signals to at least one of input and modulator configuration module 626 and sensor unit configuration and control module 630.

It should be understood that comparator 683, status circuit portion 685, transmitter 687, and/or selector 689 are discussed herein as separate entities merely for the sake of providing an example. However, the skilled person can co-locate these entities or provide one as part of the other.

In some embodiments, control unit 660 comprises a Sigma-Delta demodulator (SD demodulator) 666, a processing unit 662 that is coupled, for example via a bus 663, to SD demodulator 666, and an SD clock circuit portion 675 that is coupled to an output port 667 of control unit 660. In some embodiments SD demodulator 666 is provided like SD modulator 166 described above with reference to FIG. 1. In particular, in some implementations, SD demodulator 666 is configured to obtain the digital sense signal DS from port 669 over line 668 and to demodulate a serial data stream of the digital sense signal DS for output as a parallel data signal PDS to processing unit 662. Clock circuit portion 675 is configured to provide a clock signal CLK at output port 667 of control unit 660 and/or to SD demodulator 666. In some implementations, control unit 660 is configured to operate as described above with reference to FIGS. 1 to 5. In particular, in some implementations, clock circuit portion 675 comprises a clock generator and a clock modulator as described above with reference to FIGS. 1 to 5.

Figure 7:
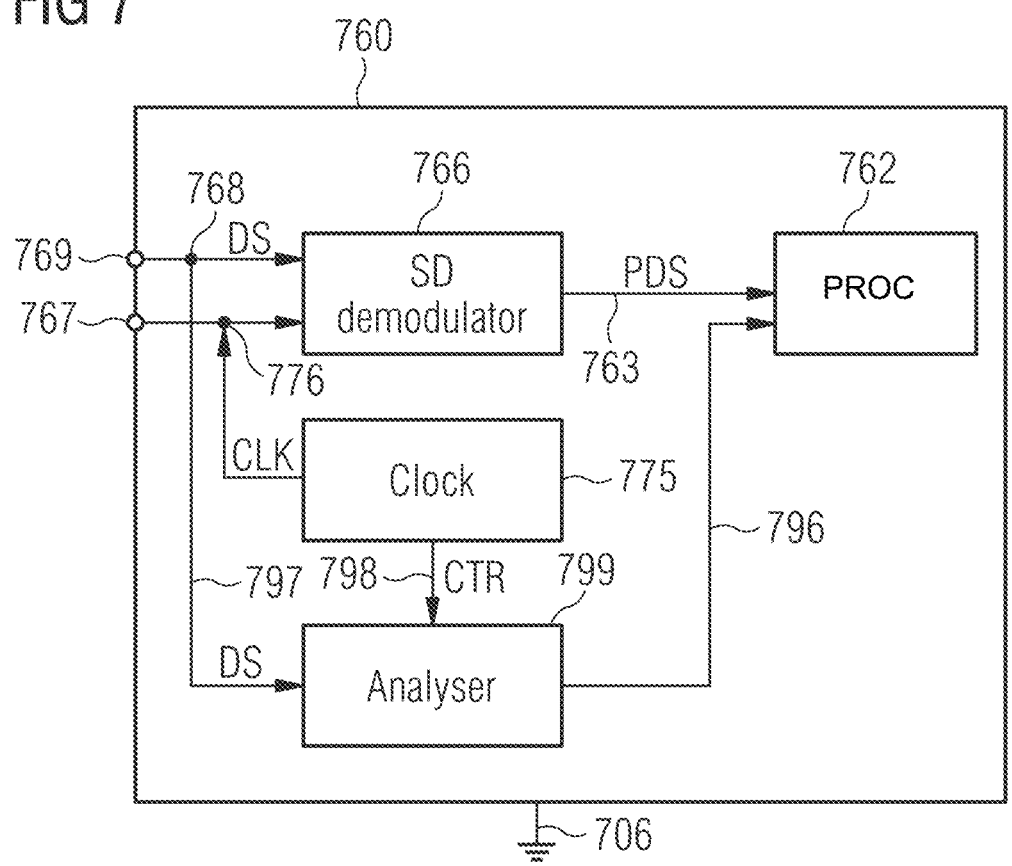
FIG. 7 illustrates a block diagram of a control unit according to some embodiments.

FIG. 7 illustrates a block diagram of an alternate control unit 760 configured for use in a measurement system according to some embodiments such as described above with reference to FIGS. 1 to 6. In particular, control unit 760 comprises components like control unit 660 described above with reference to FIG. 6. In some embodiments, control unit 760 comprises a Sigma-Delta demodulator (SD demodulator) 766 coupled, for example via a serial data signal node 768, to an input port 769 of control unit 760. Further, control unit 760 comprises a processing unit 762 that is coupled, for example via a parallel bus 763, to SD demodulator 766. Still further, control unit 760 comprises a clock circuit portion 775 that is coupled, for example via a node 776, to an output port 767 of control unit 760 as well as to SD demodulator 766. In some implementations, control unit 760 is configured to operate as described above with reference to FIGS. 1 to 6. In particular, control unit 760 can be coupled to a ground 706 at a controller ground potential. In some implementations, where one or more sensor units are coupled to control unit 760 while keeping control unit 760 electrically isolated from the sensor units, the controller ground potential may be independent from and thus, at times, differ from any sensor ground potential.

Now describing control unit 760 in more detail, in some embodiments, SD demodulator 766 is provided structurally and/or functionally just like SD modulator 166 described above with reference to FIG. 1. In particular, in some implementations, SD demodulator 766 is configured to obtain the digital sense signal DS and to demodulate a serial data stream of the digital sense signal DS for output as a parallel data signal PDS to processing unit 762. In some embodiments, clock circuit portion 775 is configured to provide a clock signal CLK at output port 767 of control unit 760 and/or to SD demodulator 766. In particular, in some implementations, clock circuit portion 775 comprises a clock generator and a clock modulator configured to provide a modulated clock signal, for example a frequency modulated clock signal or, for another example, a clock signal modulated in the duty cycle, as described above with reference to FIGS. 2 and 3.

In some implementations, control unit 760 comprises a data reception circuit portion 799, herein also briefly referred to as analyzer, that is coupled, for example by a data line 797, to input port 769 of control unit 760. In some embodiments, data reception circuit portion 799 is also coupled, for example via a control line 798, to clock circuit portion 775. Data reception circuit portion 799 is configured to receive data signals provided from input port 769. Further, in some implementations, data reception circuit portion 799 is configured to receive control signals provided from clock circuit portion 775. In some embodiments, data reception portion 799 is configured to analyze data signals provided from input port 769. In particular, analyzer 799 is configured to discriminate, in data signals provided from input port 769, digital sense signals DS from other data signals DD such as a signal that carries a predetermined status bit pattern. In some embodiments, data reception circuit portion 799 is coupled, for example via a signal line or bus 796, to processing unit 762. In some implementations the coupling is via parallel bus 763.

In some implementations, a sensor unit may be coupled to control unit 760 that is configured to output, for example upon startup and/or upon wakeup, a predetermined status bit pattern that is associated with the sensor unit's identity and/or with the sensor unit being operational. In some implementations, the sensor unit coupled to control unit 760 is configured to output the predetermined status bit pattern for a duration that is as long as or longer than a predetermined duration of Sigma-Delta demodulator settlement. In some implementations, control unit 760 is configured, when receiving the bit pattern, to check if the received bit pattern is one of predetermined status bit patterns associated with a sensor unit known to control unit 760 to be available for coupling to and/or operation with control unit 760. In some implementations, control unit 760 is configured to issue a message signal in accordance with a predetermined status bit pattern of the sensor unit that control unit 760 identified as a source of the received bit pattern. In some implementations, control unit 760 is configured to issue an error signal, if the received bit pattern differs from any predetermined status bit pattern. In contrast, where the received bit pattern corresponds to a predetermined bit pattern associated with a sensor unit to be operably coupled to control unit 760, control unit 760 is configured to trust that the sensor unit works as expected and co-operates properly with control unit 760.

In some implementations, control unit 760 is configured to control a startup and/or a wakeup operation with a sensor unit coupled to control unit 760. Given that the sensor unit's Sigma-Delta modulator typically requires some time to settle before being able to output any meaningful digital sense signal DS, control unit 760 may predetermine a time interval from requesting startup and/or wakeup, for example counting a predetermined number of clock cycles, where clock circuit portion 775 issues, via signal line 798, a control signal CTRL to data reception circuit portion 799, that activates an interpretation of received data. Thus, data reception circuit portion 799 can, for example interpret the received data as sensor unit status data, extract a sensor unit status information from the received data, and provide the sensor unit status information to processing unit 762.

In some implementations, in particular in embodiments where control line 798 is not present and in implementations where control line 798 is inactive or otherwise not used, data reception circuit portion 799 is configured to analyze received data signals in order to interpret the received data. In some implementations interpreting the data includes determining a type of data represented by the received data signal. In some embodiments the interpreting, in particular the determining the data type, is based on attribute information that is intrinsic to the data receive signal. At least one effect can be that the interpretation of the data receive signal can take into account different types of representation of information in the data receive signal. For example, in an embodiment where a sensor unit coupled to control unit 760 is configured to measure pressure, data reception circuit portion 799 is configured, where the received data represent an impossible measurement value such as a negative pressure value ("negative" here being an attribute information) to interpret the received data as status data rather than measurement data. For another example, data reception circuit portion 799 is configured, where the received data cannot be assigned to any predetermined status bit pattern associated with the sensor unit coupled to control unit 760 ("unassignable" here being an attribute information), to interpret the received data as measurement data.

Figure 8:
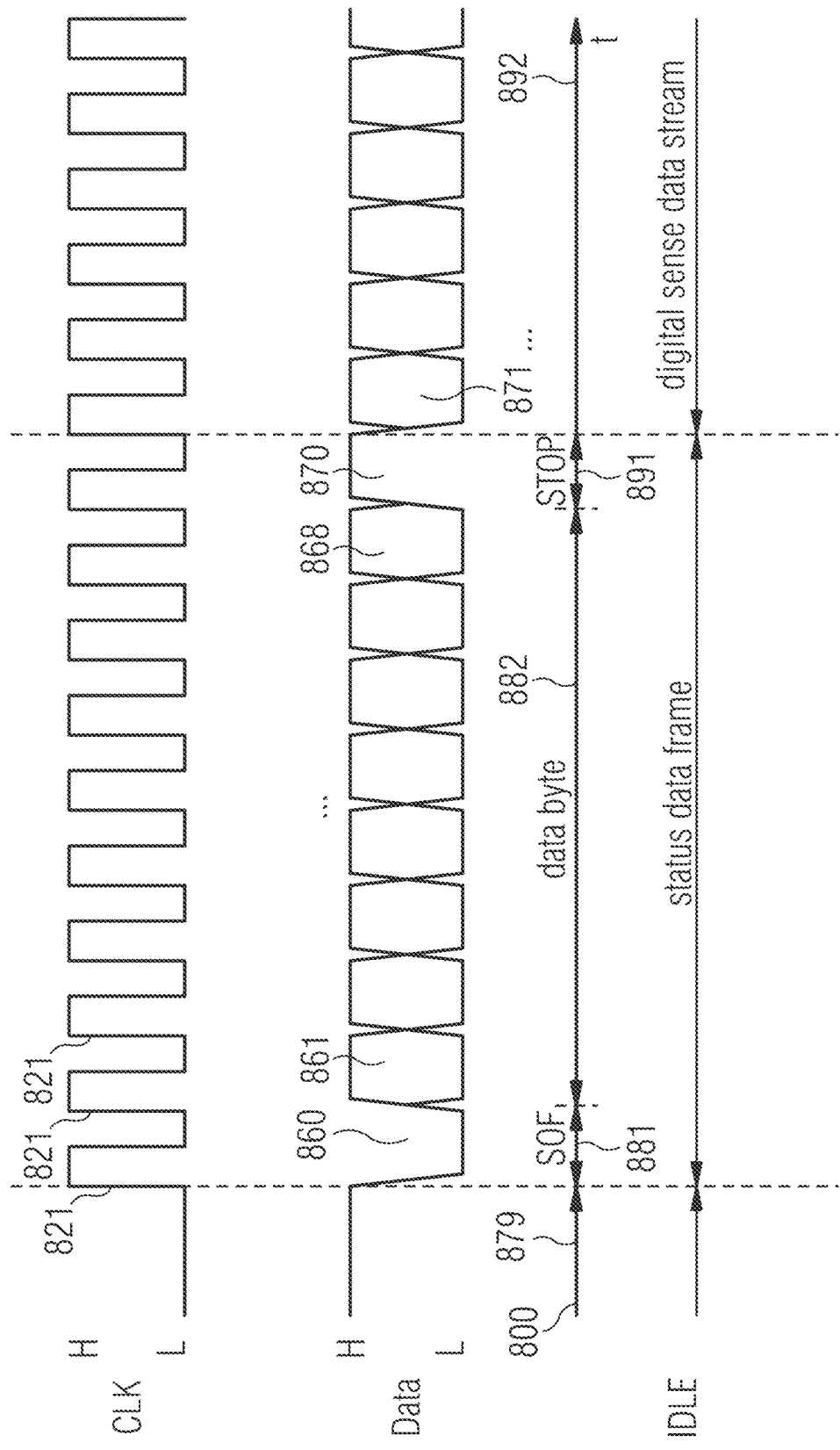
FIG. 8 illustrates a time line of signals according to some implementations.

FIG. 8 illustrates a time line 800 with a clock signal CLK as well as a digital signal according to some implementations, for example, as described above with reference to FIGS. 6 and 7. In some implementations, sensor unit 610 is configured to transmit, upon startup, sometimes also referred to as power-up, and/or upon wakeup from a power saving mode, i.e., an idle interval 879, where power consumption of sensor unit is reduced with respect to a power consumption during a full operation mode, status data before transmitting digital sense data to control unit 660, 760. In some implementations described above, clock signal CLK is received at sensor unit 660 from control unit 660, 760. It should be understood that, in some embodiments not shown in FIG. 8, the received clock signal may be modulated, for example, to communicate a wakeup request as described above, for example with reference to FIG. 1, from the control unit to the sensor unit.

In some embodiments, transmitter 687 of sensor unit 610 is configured to frame status data according to a communications protocol such as Universal Asynchronous Receiver Transmitter (UART). For example, in some implementations transmitter 687 is configured to first, during a start interval 881 lasting ten clock cycles, transmit a UART data frame having a start bit SOF 860, a data transmit interval 882 for transmission of one byte of a status data word (bits 861 to 868), and a stop transmit interval 891 to transmit a stop bit 870. After that, during an interval 892, SD modulator 616 begins streaming digital sense data DS bit 870, 871, . . . to control unit 660. At least one effect can be that, while SD modulator 616 is settling, status data can be transmitted from sensor unit 610 to control unit 660. It should be understood that status data, in some implementations, can encompass control data, configuration data, a request, for example for a retransmission of setting values from control unit 660 to sensor unit 610, and so forth. While the example describes a UART frame, it should be understood that the skilled person can contemplate use of another communications protocol to implement the techniques described herein. Meanwhile, control unit 660, in some implementations is configured to "know" the protocol used by sensor unit 610, and accordingly to count clock cycles to interpret received data, first as status data, and then as digital sense data representative of a measured physical quantity.

Exemplary Operation

Figure 9:
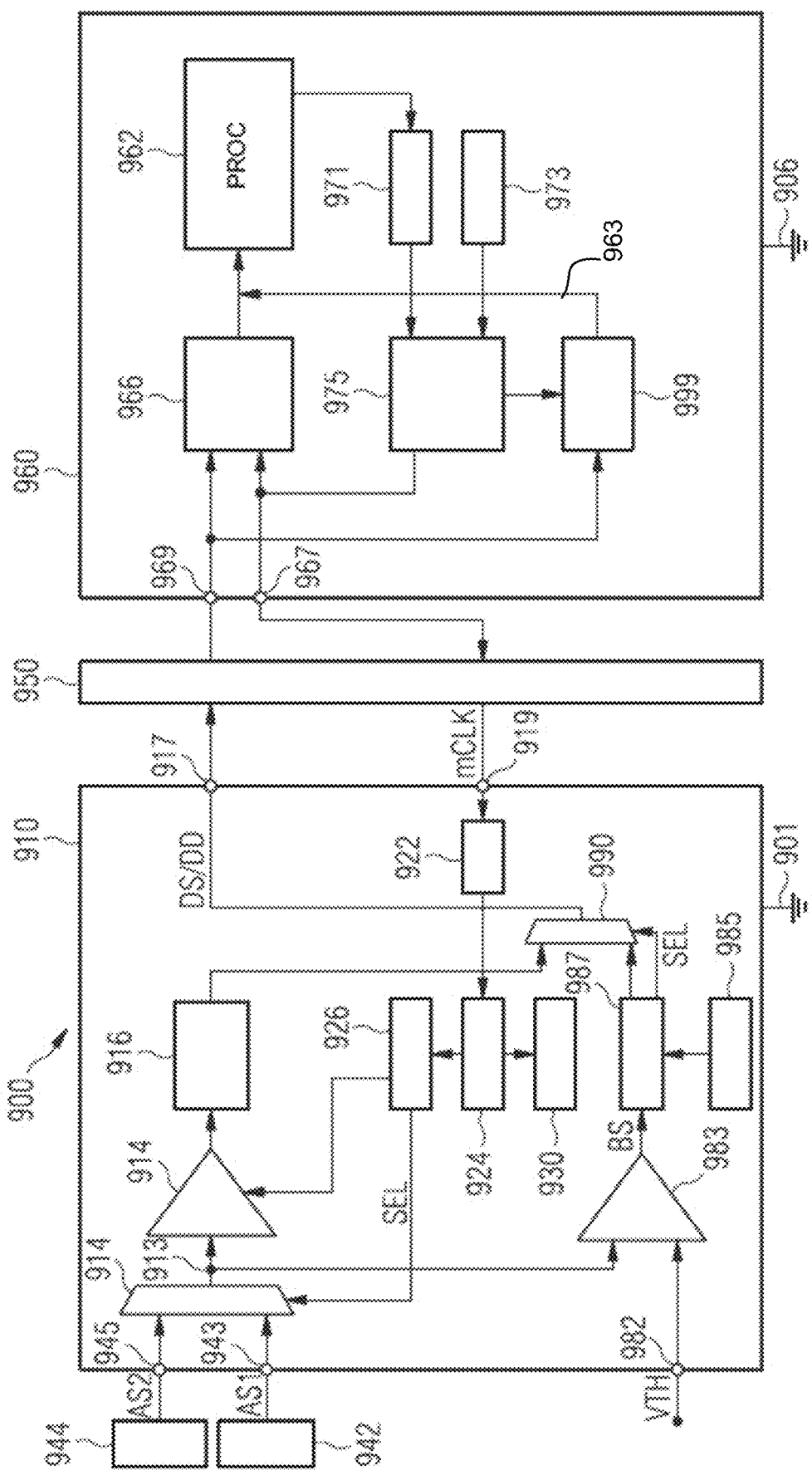
FIG. 9 illustrates a block diagram of a measurement system according to some embodiments.

Operation of some exemplary embodiments will now briefly be described. It is to be understood that the features of the various embodiments described herein may be combined with each other, unless specifically noted otherwise. Accordingly, in the following description, reference will be made to FIG. 9 that illustrates a block diagram of a measurement system 900 according to some embodiments that comprises many of the components described above with reference to embodiments illustrated in FIGS. 1 to 8. Since the components, including coupling among the components and functionality of the components of measurement system 900 according to the embodiment illustrated in FIG. 9 have already been described above with reference to other figures, for example, reference numerals 944 and 945 correspond with 44 and 45, respectively, a separate description of the embodiment shown in FIG. 9 is presently foregone.

Figure 10:
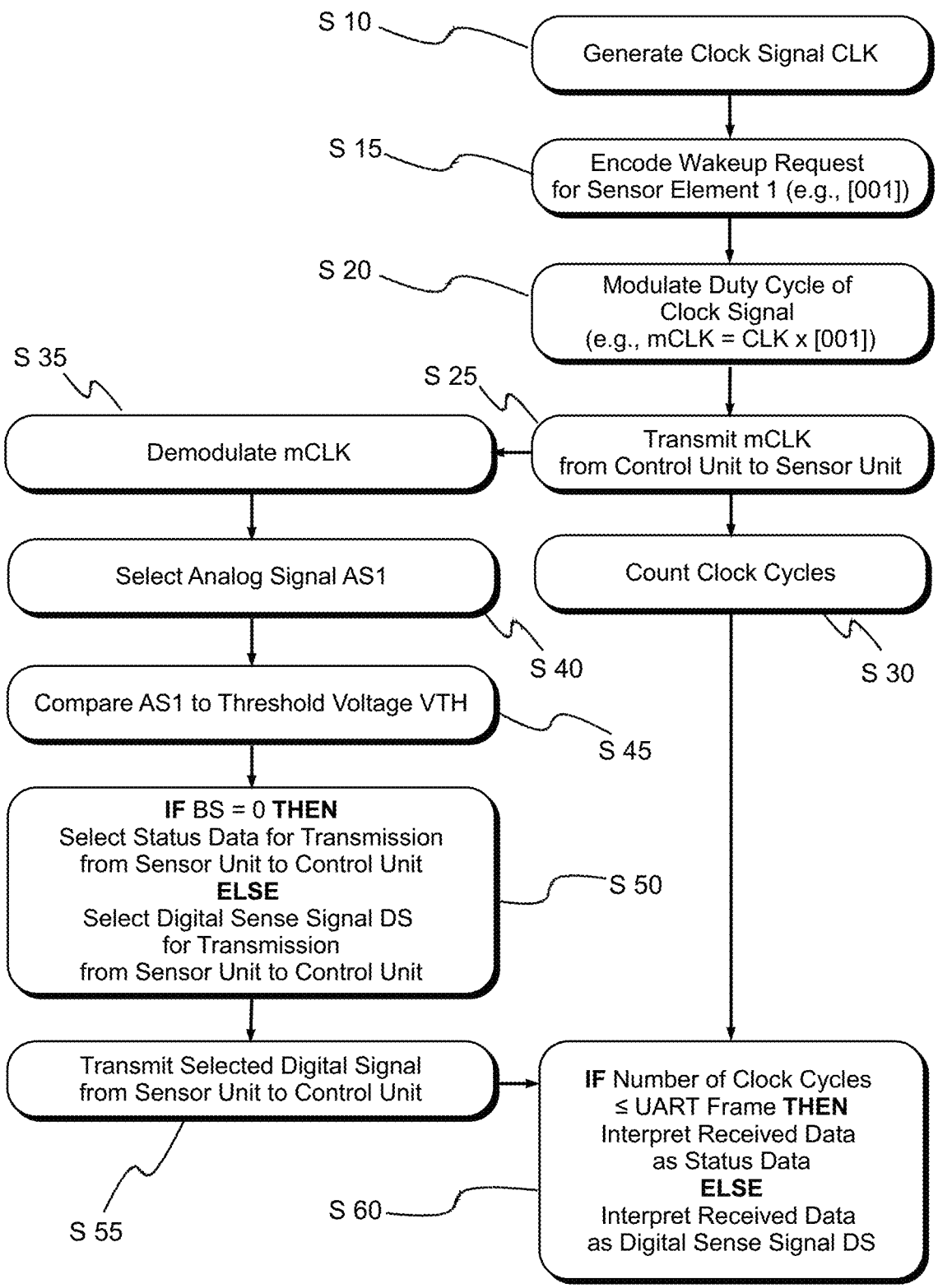
FIG. 10 illustrates a flow chart of a method implemented in a measurement system according to some embodiments.

FIG. 10 illustrates a flow chart of a method implemented, for example, in measurement system 900 according to some embodiments.

At S 10, clock generator 973 generates a clock signal CLK, for example as shown in FIG. 8 having a clock edge 821. At S15 communication interface 971 receives, from processing unit 962, a request to wake up sensor 1 that, for example, is configured to measure temperature. Communication interface 971 provides a bit code [001] that corresponds to the processing unit's request to Sigma-Delta clock modulator 975. At S20, Sigma-Delta clock modulator 975 modulates a duty cycle of clock signal CLK, for example as shown in FIG. 2, in order to encode the bit code [001] in a modulated clock signal mCLK. At S 25, Sigma-Delta clock modulator 975 transmits the modulated clock signal mCLK via a clock output port 967 of control unit 960 and, further, via an interface 950 at an electrical isolation barrier that separates a controller ground potential 906 from a sensor ground potential 901, to a clock input port 919 of sensor unit 910. At S 30, still at control unit 960, a counter (not shown), henceforth, counts clock cycles.

At S 35, now at sensor unit 910, a Sigma-Delta clock demodulator 922 receives the modulated clock signal mCLK in order to extract the bit sequence [001] that is encoded in the modulated clock signal mCLK. At S 40, a communication interface 924 receives the bit sequence [001] from Sigma Delta clock modulator 922 and issues a corresponding request signal to an input and modulator configuration module 926 and to module 930. Still at S 40, input and modulator configuration module 926 issues a select signal to multiplexer 914. Further, input and modulator configuration module 926 issues a gain set signal to an input stage 914.

At S 45, in accordance with the select signal received from input and modulator configuration module 926, multiplexer 914 selects a first analog signal AS1 that is received from a temperature sensor element 942 via a sensor unit input port 943 and forwards the selected first analog signal AS1 to input stage 914 via node 913 and to comparator 983. At S 45, comparator 983 compares the first analog signal AS1 to a threshold voltage level VTH set at the reference voltage port 982. Comparator 983 outputs a bit signal BS=0 to a transmitter 987, and transmitter 987 outputs a corresponding select signal SEL to a multiplexer 990. In addition, transmitter 987 outputs status data received from status circuit portion 985 to multiplexer 990 in a data status data signal DD. The digital status data signal DD, according to some embodiments, lasts for a number of clock cycles. In some implementations the status data are transmitted in a data frame as shown, for example, in an implementation according to the Universal Asynchronous Receiver Transmitter (UART) protocol that is illustrated in FIG. 8. Meanwhile, input stage 914 processes the selected first analog signal AS1 in accordance with the gain set signal received from input and modulator configuration module 926. Input stage 914 provides a processed analog signal PAS to a Sigma-Delta modulator 916. Sigma-Delta modulator 916 outputs a digital sense signal DS to multiplexer 990.

At S 50, in accordance with the select signal SEL received from transmitter 987, multiplexer 990 selects the status data received from transmitter 987. At S55, the digital status data signal DD is transmitted from multiplexer 990, via an output port 917 of sensor unit 910, and via interface 950, to an input port 969 of control unit 960.

At S60, the digital signal received at control unit 960 is provided from a signal input port 969 to Sigma-Delta demodulator 966 as well as to a data reception circuit portion 999. As long as a number of clock cycles counted at S 30 does not exceed the predetermined limit, for example 10 clock cycles, clock circuit portion 975 outputs a control signal CTRL to data reception circuit portion 999 that requests an interpretation of the received digital signal in order to extract status information from the received digital signal, i.e., in accordance with the fact that the received digital signal is, in fact, the digital status data signal DD. Accordingly, data reception circuit portion 999 provides, via a bus 963, a bit word to processing unit 962 for further processing, wherein the bit word indicates that the sensor element 942 is responsive to the request and in working order, and that sensor element 942 will shortly provide measurement data to control unit 960.

Having completed a number of clock cycles, sensor element 942 provides a stronger signal than at the beginning of the wakeup. Now, again at S 45, if the analog signal AS1 provided from first sensor element 942 exceeds the threshold voltage level VTH, then comparator 983 outputs a bit signal BS=1 to transmitter 987, and transmitter 987 outputs a corresponding select signal SEL to a multiplexer 990. Again at S 50, in accordance with the select signal SEL received from transmitter 987, multiplexer 990 selects the digital sense signal DS received from Sigma-Delta modulator 916. Again at S55, the digital sense signal DS is transmitted from multiplexer 990, via output port 917 of sensor unit 910, and via interface 950, to input port 969 of control unit 960.

Again at S 60, the digital signal received at control unit 960 is provided from a signal input port 969 to Sigma-Delta demodulator 966 as well as to the data reception circuit portion 999. Once the number of clock cycles counted at S 30 exceeds the predetermined limit, for example, if more than 10 clock cycles have passed since the wakeup request was issued to sensor unit 910, then clock circuit portion 975 outputs a control signal CTRL to data reception circuit portion 999 that requests to stop an interpretation of the received digital signal. Instead, Sigma-Delta demodulator 966 provides, via bus 963, a parallel digital signal to processing unit 962 for further processing. Thus, in accordance with the fact that the received digital signal is, in fact, the digital sense signal DS that represents the processed analog signal PAS, control unit 960 interprets the received digital signal as a digital representation of an analog signal and extracts measurement value information from the received digital signal.

Below further embodiments are described. However, it is intended that this invention be limited only by the claims and the equivalents thereof.

Exemplary Embodiments with Clock Signal Modulation

In an aspect the description describes a method for use in a measurement system. The measurement system comprises a barrier that electrically separates a first ground potential from a second ground potential. Thus, the second ground potential can differ from the first ground potential. The method comprises, at an interface provided at the barrier, receiving, at a controller side of the barrier, a clock receive signal that represents a clock signal and control information, for example comprising configuration information. The method comprises providing, based on the clock receive signal, a control signal that represents at least the control information. In some embodiments the providing happens on a sensor side of the barrier. The method comprises transmitting the control signal from the interface to a sensor unit on the sensor side of the barrier. Some embodiments comprise operating the sensor unit according to the control information. Some embodiments comprise configuring the sensor unit according to configuration information comprised in the control information. Some embodiments comprise, based on the clock receive signal, providing a clock transmit signal that includes the clock signal and transmitting the clock transmit signal to the sensor unit.

Some embodiments comprise, in particular on the controller side of the barrier, modulating the clock signal according to the control information in order to obtain the clock receive signal. In particular, the modulating the clock signal is according to other information than timing. At least one effect can be that, in a modulated clock signal as the clock receive signal, the control information can be transmitted across the barrier together with the clock signal. In some implementations, therefore, no extra line is needed. In some embodiments the modulating the clock signal comprises varying a duty cycle of the clock signal. In some implementations the varying is performed between at least two predetermined duty cycle values associated with a binary representation, i.e., in some implementations, in particular, a binary representation of the control information. For example, a duty cycle of the value 0.3 can be modulated to a duty cycle of the value 0.7, and vice versa. In some embodiments a bit value may be associated with the respective duty cycle value, for example, bit value zero with a duty cycle of 0.7 and bit value one with the duty cycle of 0.3, or vice versa. Or, for another example, a duty cycle of 0.4 can be modulated to 0.6, and vice versa. Other modulations may be asymmetric such as a duty cycle of 0.3 being modulated to 0.6, and vice versa. In some embodiments the modulating comprises varying a number of clock cycles to form a clock signal pulse width so as to represent a bit value associated with the clock signal pulse width.

Some embodiments comprise, based on the clock receive signal, providing, on the sensor side of the barrier, a clock transmit signal that includes the clock signal. Some implementations of the method then comprise transmitting the clock transmit signal from to the sensor unit.

In some implementations the sensor unit comprises an analog-to-digital converter. Some embodiments comprise providing, at the analog-to-digital converter, an analog sense signal. Further, some implementations comprise clocking, based on the clock signal, the analog-to-digital converter. Some implementations comprise converting the analog sense signal into a digital sense signal. In some embodiments the analog-to-digital converter is used in the converting.

Some embodiments comprise referencing the analog-to-digital converter to a sensor unit reference voltage. Some embodiments comprise referencing the control unit to a control unit reference voltage. In some implementations the sensor unit reference voltage differs from the control unit reference voltage. In some embodiments at least one of the following is performed according to and/or based on configuration information comprised in the control information: receiving the analog sense signal, converting the analog sense signal into the digital sense signal, transmitting the digital sense signal to the interface.

Some embodiments comprise transmitting the digital sense signal from the sensor side of the barrier, to the interface. Some embodiments comprise transmitting the digital sense signal from the interface to the controller side of the barrier. At least one effect can be to transmit the digital sense signal across the barrier, i.e., from the analog-to-digital converter, via the interface, to the control unit.

In another aspect the description describes an interface for use in a measurement system comprising a barrier that electrically separates a first ground potential on a sensor side of the barrier from a second ground potential on a controller side of the barrier. Some embodiments of the interface comprise a first receive terminal configured to receive a digital receive signal from a sensor unit on the sensor side of the barrier, wherein the interface is configured to provide a digital transmit signal that represents the digital receive signal, i.e., information carried or otherwise represented by the digital receive signal. Further, the interface comprises a first transmit terminal configured to transmit the digital transmit signal to a control unit on the controller side of the barrier. In some embodiments at least one effect can be that the interface is configured to receive the digital receive signal from the sensor side of the barrier being referenced to a first reference voltage and that the interface is further configured to forward the transmit signal across the barrier to the controller side of the barrier being biased at a second reference voltage. Some embodiments comprise a second receive terminal configured to receive a clock receive signal from the controller side of the barrier. In some embodiments the interface is configured to provide, based on the clock receive signal, a control transmit signal that includes control information provided with the clock receive signal. Some embodiments comprise a second transmit terminal configured to transmit the control transmit signal from the interface to the sensor unit. In some embodiments the interface is configured to extract control information such as configuration information from the clock receive signal. At least one effect can be that the interface can interpret the control information, if any, provided with the clock receive signal. In some embodiments, at least one effect can be that the interface can co-operate with a conventional analog-to-digital converter that is not configured to use control information, while the interface provides the control information to the sensor unit irrespective of whether the sensor unit interprets the information or not. For example, in some embodiments the interface broadcasts the control information represented by the clock transmit signal. In some embodiments, the sensor unit uses the clock signal provided with the clock transmit signal, for example to clock an operation of a Sigma-Delta converter, but does not use any control information provided with the clock transmit signal.

In some embodiments the interface is configured to provide, based on the clock receive signal, a control transmit signal that represents the control information. At least one effect can be that the interface, using the control transmit signal, can provide configuration information received, for example, from the control unit on the a controller side of the barrier to the sensor unit on the sensor side of the barrier. In particular, as control information, the interface can provide configuration information for use in operation of an analog-to-digital converter comprised in the sensor unit.

In some embodiments the interface is configured to provide the control transmit signal so as to represent both, the clock signal and the control information. At least one effect can be that, transmitting the clock transmit signal, both can be transmitted on one line, the clock signal and the control information, in particular, the configuration information.

Some embodiments comprise a third transmit terminal configured to transmit the control transmit signal separately from the clock transmit signal. At least one effect can be that another recipient on the sensor side of the barrier can receive the control transmit signal. Thus, for example, where another recipient is a settings register of the sensor unit, control information can be transmitted to the sensor unit in order to set the settings register in accordance with setting information included in the control information.

In some embodiments the interface is configured to extract the control information from the clock receive signal, for example, by demodulation of the clock receive signal. In some embodiments the interface is configured to extract the control information from the clock receive signal by interpreting a width of pulses included in the clock receive signal. In some embodiments the interface is configured to extract the control information from the clock receive signal by interpreting a duty cycle of the clock receive signal. In some implementations, the extracted control information is configuration information for use in configuring the sensor unit.

In some embodiments the interface is configured to form the clock transmit signal so as to exclude the control transmit information. At least one effect can be that the interface can co-operate with a conventional sensor unit that requires a predetermined clock signal shape.

In some embodiments the first receive terminal on the sensor side of the barrier is configured to be referenced to a sensor side reference voltage such as a first ground potential, herein also referred to as sensor side ground potential, while the first transmit terminal is configured to be referenced to a controller side reference voltage such as a second ground potential, herein also referred to as controller ground potential. In some embodiments the second receive terminal is configured to be biased at the controller side reference voltage and the second transmit terminal is configured to be referenced to the sensor side reference voltage. At least one effect can be that the interface keeps the controller side electrically separate from the sensor side so as to achieve, in particular at the controller side, an operation that is resistant to variations of reference voltage at the sensor side.

In another aspect the description describes a control unit for use in a measurement system comprising a barrier that electrically separates a controller side reference voltage from a sensor side reference voltage. The control unit is configured to operate at a controller side reference voltage, and to process data that are acquired by at least one sensor unit and/or received from the at least one sensor unit. The control unit is further configured for coupling to an interface, provided at the barrier and configured to communicate across the barrier, to one or more sensor units operated at a sensor side reference voltage. The control unit is further configured for coupling to a clock unit that is coupled to the interface so as to provide a clock signal to the interface. Further, the control unit is configured to provide control information to the clock signal for modulating the clock signal to form a modulated clock signal that represents the control information.

In a further aspect the invention encompasses a measurement system comprising a barrier that electrically separates a first reference voltage from a second reference voltage.

The measurement system is configured for use in acquisition of measurement data. The measurement system comprises a control unit configured to operate with a controller side reference voltage such as a controller side ground potential. In some embodiments, the control unit is configured to process data that, for example, are acquired by at least one sensor unit. The measurement system further comprises an interface coupled to the control unit. Further, the interface is configured to couple to one or more sensor units operated at a sensor side reference voltage such as a sensor side ground potential. The measurement system is configured to provide a clock signal to the interface. Some embodiments comprise a clock unit coupled to the interface. In some embodiments, the clock unit is configured to provide the clock signal to the interface. In some embodiments the interface is configured to provide, based on the clock signal, a control transmit signal. In some embodiments the control unit is configured to provide control information to the clock unit. In some embodiments the clock unit is configured to provide a clock receive signal at the interface that is formed so as to include both, the clock signal and the control information in a clock receive signal provided to the interface. In some embodiments the clock unit is configured to form the clock receive signal by modulating the clock signal according to other information than timing. In some embodiments the modulating comprises varying a number of Sigma-Delta clock cycles to form a clock signal pulse width associated with a binary representation of the control information, i.e., in some embodiments, so as to represent a bit value.

In yet another aspect the disclosure encompasses a sensor unit for use in acquisition of measurement data. The sensor unit comprises an analog-to-digital converter configured to convert an analog sense signal into a digital sense signal. In some embodiments the sensor unit is configured to receive a clock receive signal. The sensor unit is configured to extract a clock signal from the clock receive signal. In some embodiments the sensor unit is configured to extract control information from the clock receive signal. In some embodiments the sensor unit is configured to configure the analog-to-digital converter according to configuration information comprised in the control information. At least one effect can be that the sensor unit can be configured to switch data acquisition so as to achieve acquiring data related to different physical quantities. For example, the sensor unit can be configured to switch between detecting a temperature and a current.

In still another aspect the description encompasses a medium for storing instructions that when executed cause one or more processors to perform steps of a method for use in an acquisition of measurement data. The method comprises receiving a clock receive signal at an interface; providing, based on the clock receive signal, a control transmit signal that represents a control information comprised in the clock receive signal; transmitting the control transmit signal to an analog-to-digital converter; and setting the analog-to-digital converter according to the control information.

Exemplary Embodiments with Multiple Data Type Transmission

The description describes a method for use in a measurement system. The system comprises a sensor unit. The number of sensor units comprised in the system need not be limited to one. In some embodiments the system comprises a plurality of sensor units. The measurement system comprises a control unit. In some implementations the control unit is configured to process data provided by the sensor unit. In some embodiments the sensor unit is configured to detect at least one quantity, in particular one or more of a physical quantity such as acceleration, current, in particular phase current, voltage and the like. In some embodiments the sensor unit is configured to form a sensor data signal that represents the quantity. The sensor data signal is to be transmitted from the sensor unit to the control unit. The method comprises, in some embodiments at the control unit, receiving a data receive signal. In some embodiments the data receive signal is the sensor data signal provided by the sensor unit. In some embodiments the method comprises interpreting the data receive signal to be one of at least: the sensor data signal and another data signal. In some embodiments, the sensor data signal represents a detected first quantity, while another data signal is another sensor data signal that represents a detected second quantity. In some embodiments the interpreting is selecting a predetermined interpretation and the selecting is based on predetermined selection criteria. At least one effect can be that the interpretation of the data receive signal can take into account plausibility of the data receive signal to represent one type of information out of a plurality of possible types of information.

In some embodiments the interpreting is based on attribute information that is intrinsic to the data receive signal. At least one effect can be that the interpretation of the data receive signal can take into account different types of representation of information in the data receive signal. For example, a first type of representation of information may be a coarse low bit number representation of the quantity while a second type of representation of information is a more precise high bit number representation of the quantity. In some embodiments the low bit number representation is provided as a single bit representation indicative of the quantity being detected to exceed a predetermined threshold. At least one effect can further be that transmission of overhead comprising the attribute information from the sensor unit to the control unit can be avoided. In particular in an embodiment where the usage of bandwidth to transmit information is very limited, usage of bandwidth can be restricted to transmit only payload. Thus, at least one effect can be that a single data signal can be used to convey information about a plurality of parameters. For example, where the parameter is sensor control, the information is interpreted as sensor control information. For example, where the parameter is measurement of a first quantity, the information is interpreted as detected value of the first quantity. For example, where the parameter is measurement of a second quantity, the information is interpreted as a detected value of the second quantity. At least one effect can be that the single data signal can be used to convey information about a same parameter with different levels of precision. For another example, where the parameter is a representation of a measured quantity with a first level of precision, the information is interpreted as a digital representation of the measured quantity with a first level of precision; for instance a 1 bit representation is interpreted as a low precision digital representation. For example, where the parameter is a representation of a measured quantity with a second level of precision, the information is interpreted as digital representation of the measured quantity with a second level of precision; for instance, a multi-bit representation is interpreted as a high precision digital representation. Thus, in some cases, the quantity can quickly be detected at startup of the sensor unit with a low level of precision, while a measurement with a relatively higher level of precision may require more time from startup or wakeup. Accordingly, at startup, the quantity is sufficiently represented by the coarse digital representation, while at a later stage the quantity is more suitably represented by the high precision digital representation. The single data signal can thus first be used to transmit a result of a low precision measurement, before later being used to transmit a result of a high precision measurement.

In some embodiments the attribute information is time information. In some embodiments the time information is a duration of an interval between a point in time when a control signal was sent to the sensor unit, and a point in time, when the data receive signal was received. At least one effect can be that the time information can be used to imply plausibility. For example, where a wakeup request was sent to the sensor unit that is assumed to be in an essentially non-operational sleep state or other low power mode, and where a very short time later the data receive signal is received, it is plausible that the sensor unit did not yet respond by transmitting any meaningful measurement data, since the sensor unit needs time to transit from the sleep state of operation in a low power mode to the operational state of operation in a full power mode. In some embodiments a transition time interval is predetermined sufficiently large for the sensor unit to transit from a first state to an operational state that differs from the first state. In some embodiments the first state is a reduced power mode and the control signal is indicative of a wakeup request.

In some embodiments the attribute information is a bit pattern received with the data receive signal. At least one effect can be that in a system having a single data signal line, information related to a plurality of parameters can be transmitted particularly efficiently. In some embodiments the attribute information is a value represented by the data receive signal. At least one effect can be that the data receive signal, if interpreted to represent a value of the first data type, would provide an implausible value, for example a negative scalar speed value, the data receive signal can plausibly be interpreted to represent a value of the second data type, for example, a negative temperature in degree Celsius.

Disclosed herein in another aspect is a sensor unit for use in measurement data acquisition that comprises a first analog-to-digital converter configured to output a first resolution digital sense signal derived from an analog sense signal, and a second analog-to-digital converter configured to output a second resolution digital sense signal derived from the analog sense signal. The sensor unit is configured to selectively transmit, for example, depending on a predetermined condition being met, either the first resolution digital sense signal or the second resolution digital sense signal. Given that, upon starting sensor unit operation, the first resolution digital sense signal may more rapidly be generated as a true representation of a detected quantity than the second resolution digital sense signal as a true representation of the detected quantity, at least one effect can be that the sensor unit, by using the first analog-to-digital converter, can rapidly provide a true representation of the detected quantity, albeit of low resolution, before it is able to provide a true representation of the detected quantity in high resolution by using the second analog-to-digital converter.

In some embodiments the first analog-to-digital converter is provided as a comparator configured to compare the analog sense signal to a threshold value. In some embodiments the first resolution digital sense signal is one bit comparison result signal. In some embodiments other information such as sensor unit status information is folded onto the one bit comparison result signal. For example, where a comparison bit value is 1 to indicate that the sensor unit is not yet ready for a fine resolution measurement, but that the sensor unit is operative and/or that the physical quantity is being detected, configuration data such as an identification token associated with a sensor element or transducer used in the measurement is OR-ed or otherwise combined with the comparison bit value 1 and transmitted to the control unit. In some embodiments the second resolution digital sense signal comprises a multi bit representation derived from the analog sense signal. In some embodiments the first analog-to-digital converter forms a structural part of the second analog-to-digital converter; for example, the first analog-to-digital converter forms a most significant bit portion of the second analog-to-digital converter. In some embodiments the sensor unit is configured to transmit, during a predetermined interval upon startup, the 1 bit comparison result signal, before transmitting the second resolution digital sense signal.

In some embodiments, the measurement system comprises a barrier that electrically separates a first reference voltage such as first ground potential or a first operating potential from a second reference voltage such as a second ground potential or a second operating potential. The sensor unit is provided on a sensor side of the barrier, while the control unit is provided on a controller side of the barrier. A communication interface is provided at the barrier. In some embodiments, the sensor unit transmits the status data signal and the second digital sense signal, via the communication interface at the barrier, to the control unit. In some embodiments, the control unit transmits control information and/or a clock signal, via the communication interface at the barrier, to the sensor unit. In yet another aspect the description discloses a sensor unit for use in an acquisition of measurement data. The sensor unit comprises an analog-to-digital converter configured to output a first resolution digital sense signal derived from an analog sense signal. The sensor unit further comprises a second analog-to-digital converter configured to output a second resolution digital sense signal derived from the analog sense signal. The sensor unit is configured to selectively transmit either the first resolution digital sense signal or the second resolution digital sense signal.

In some embodiments, the first analog-to-digital converter is provided as a comparator configured to compare the analog sense signal to a threshold value. In some embodiments, the first resolution digital sense signal is one bit comparison result signal. In some implementations, the sensor unit is configured to transmit, during a predetermined interval upon startup or wakeup of the sensor unit, the one bit comparison result signal, before transmitting the second resolution digital sense signal. In some embodiments, the second resolution digital sense signal comprises a multi bit representation derived from the analog sense signal.

Disclosed herein in another aspect is a sensor unit comprising an analog-to-digital converter configured to output a digital sense signal derived from an analog sense signal, a control circuit configured to derive a status data signal from status information. In some embodiments status information relates to a status of the sensor unit, for example to settings and/or to a configuration of the analog-to-digital converter. The control circuit portion is further configured to receive operational information and, based on the operational information, to derive a select signal. The sensor unit further comprises a transmit select unit, for example a multiplexer, configured to receive the select signal. In some embodiments, the transmit select unit is configured to form, based on the operational information data signal, a transmit select signal indicative of the status data signal or the digital sense signal. At least one effect can be that a given transmission facility and/or transmission medium such as a wire, for example for serial communication, can be used to transmit status data in place of the digital sense signal, for example, while the digital sense signal is unlikely to represent any meaningful data, for example during an initialization of the analog-to-digital converter. In some implementations the status data signal includes a result of comparing the analog sense signal to a reference signal. In some embodiments the reference signal is provided as a predetermined threshold voltage level.

In some embodiments the transmit select unit is configured to receive the digital sense signal and the status data signal. In some embodiments receiving the digital sense signal and receiving the status data signal can be independent from one another, in particular, in some implementations of such embodiments the receiving of both signals can take place simultaneously.

In some embodiments the transmit select unit is configured to output, in accordance with the transmit select signal, the status data signal or the digital sense signal as a sensor unit output signal.

In some embodiments the sensor unit is configured for coupling to an interface to a measurement system control unit. At least one effect can be that, where the interface is configured to electrically separate the measurement system control unit from the sensor unit, the sensor unit can operate at a sensor reference voltage while the measurement system control unit can operate at a control unit reference voltage. In some implementations thereof the sensor reference voltage and the control unit reference voltage can float independently and/or arbitrarily vary with respect to one another. In some embodiments the sensor unit is configured to provide the sensor unit output signal to the interface.

In some embodiments the sensor unit is configured to receive, from the interface, a clock receive signal. In some embodiments the sensor unit is configured to extract, for use in operation of the analog-to-digital converter, a clock signal from the clock receive signal. In some embodiments the sensor unit is configured to extract control information from the clock receive signal. In some embodiments the sensor unit is configured to configure the analog-to-digital converter according to the control information.

In still another aspect the description describes an apparatus for use in measurement data acquisition. The apparatus comprises a discriminator unit configured to be coupled to an interface to a sensor unit. Therein, the discriminator unit is configured to receive a digital signal from the interface. In some embodiments the discriminator unit is further configured to discriminate a status data signal, for example representing information on a status of the sensor unit, from a digital sense signal comprised in the digital signal received from the interface. The apparatus further comprises a processing unit coupled to the discriminator unit and configured to process the digital sense signal.

In some embodiments the processing unit is configured to extract status data from the status data signal.
In some embodiments the discriminator unit is configured to base the discriminating on at least one of time information, a bit pattern comprised in the digital signal, and a bit value represented by the digital signal. At least one effect can be that the discriminating can be based on appearance of the digital signal received from the interface. In some embodiments the time information is a difference from a point in time when the apparatus, for example using the interface, directed a control signal to the sensor unit. At least one effect can be that the control signal can be used to initiate a reconfiguration of the sensor unit or to have the sensor unit transit from a first mode of operation to a second mode of operation. For example, the control signal can be indicative of a request that the sensor unit wake up from a low or reduced power mode, for example, an idle mode or sleep state, and enter a full power mode, for example, an operational mode or state. In some embodiments the difference is predetermined sufficiently large for the sensor unit to transit from a first state to an operational state that differs from the first state. At least one effect can be that the difference can be predetermined sufficiently large for the sensor unit to transit from a lower power mode to a full power mode.

In yet another aspect the description describes a measurement system for use in acquisition of measurement data. The measurement system comprises at least one sensor unit configured to form, based on a detected quantity, an analog sense signal and to provide, based on the analog sense signal, a digital data signal. The measurement system comprises an interface coupled to the at least one sensor unit and configured to receive the digital data signal, a discriminator unit configured to extract a digital sense signal from the digital data signal received at the discriminator, and a processing unit coupled to the interface and configured to receive the digital sense signal from the interface. In some embodiments the discriminator unit is coupled to the control unit and configured to extract status data from a status data signal comprised in the digital data signal received at the discriminator. The status data, for example, include settings information, configuration information, voltage supply information, coupled sensor element identification information and/or input stage gain information used at the sensor unit. At least one effect can be that the processing unit can use the status data in processing the digital data signal.

Some embodiments comprise a clock unit coupled to the interface and configured to transmit, via the interface, a clock transmit signal that represents a clock signal. In some embodiments the clock unit is configured to form the clock transmit signal so as to represent, in addition to the clock signal, control information such as a configuration request and/or settings value.

In still a further aspect the description describes a medium for storing instructions that when executed cause one or more processors to perform steps of a method for use in measurement data acquisition. This method comprises, at a control unit, receiving a data receive signal provided by a sensor unit that is configured to detect a quantity and form a sensor data signal corresponding to the data receive signal. The method further comprises interpreting the data receive signal to represent one of at least: a sensor data signal and another data signal, wherein the interpreting is based on an attribute information intrinsic to the data receive signal. In some embodiments the attribute information is a difference from a point in time when a control signal was sent to the sensor unit. In some embodiments the difference is predetermined sufficiently large for the sensor unit to transit from a low power mode to a high power mode. In some embodiments the attribute information is a value represented by the data receive signal.

Other embodiments include the computer program for performing one of the methods described herein, stored on a machine readable data carrier. One embodiment is a data carrier (or a digital storage medium, or a computer-readable medium) including, recorded thereon, the computer program for performing one of the methods described herein. The data carrier, the digital storage medium or the recorded medium are typically tangible and/or non-transitionary.

As used herein, 'extracting the clock signal and/or extracting the another signal', in particular where the clock signal and the another signal are multiplexed or interwoven, does not in every case require a separation of one from the other but encompasses linear processing of the clock receive signal, for example, by amplifying the clock receive signal to form the transmit signal.

Some or all method steps described herein may be executed by (or using) a hardware apparatus, like for example, a microprocessor, a programmable computer or an electronic circuit. In some embodiments a programmable logic device (for example a field programmable gate array) may be used to perform some or all of the functionalities of the methods described herein. In some embodiments, a field programmable gate array may cooperate with a microprocessor in order to perform one of the methods described herein.

Generally, the methods can be performed by any hardware apparatus.

The disclosed arrangements may be implemented partially or fully in hardware using logic circuits or VLSI design.

As used herein, various links, including communications channel, connecting the elements can be wired or wireless links, or any combination thereof, or any other known or later developed element(s) that is capable of providing and/or communicating data to and from the connected elements.

As used herein, the terms 'unit' or 'module' can refer to any known or later developed hardware, software, firmware, or combination thereof that is capable of performing the functionality associated with that element.

As used herein, the word 'port' denotes a conductor line or other circuit element or circuitry configured to link coupled components. In some implementations two terminals, i.e., a first terminal and a second terminal, can essentially be implemented collocated and/or formed in one physical structure, for example, as a single portion of a signal bus line.

As used herein, the word 'exemplary' means serving as an example, instance, or illustration. Any aspect or design described herein as 'exemplary' is not necessarily to be construed as preferred or advantageous over other aspects or designs. Rather, use of the word exemplary is intended to present concepts and techniques in a concrete fashion.

As used herein, the term 'techniques,' for instance, may refer to one or more devices, apparatuses, systems, methods, articles of manufacture, and/or computer-readable instructions as indicated by the context described herein.

As used herein, the articles 'a' and 'an' should generally be construed to mean 'one or more,' unless specified otherwise or clear from context to be directed to a singular form.

As used herein, the term 'or' is intended to mean an inclusive 'or' rather than an exclusive 'or.'

As used herein, terms such as 'first', 'second', and the like, are also used to describe various elements, regions, sections, etc. and are also not intended to be limiting.

As used herein, the terms 'low resolution' and 'high resolution' are meant to be relative to each other. Thus, 'low resolution' means a resolution not as high as the high resolution and 'high resolution' means a resolution not as low as the low resolution.

As used herein, the terms 'coupled' and 'connected' may have been used to describe how various elements interface. Unless expressly stated or at least implied otherwise, such described interfacing of various elements may be either direct or indirect.

As used herein, the terms 'having', 'containing', 'including', 'with' or variants thereof, and like terms are open ended terms intended to be inclusive. These terms indicate the presence of stated elements or features, but do not preclude additional elements or features.

As used herein, the word 'transceiver' means an ensemble of transmitter functionality and receiver functionality. In some implementations, transmitter functionality and receiver functionality are collocated in a single apparatus such as a single circuit, but transmitter functionality and receiver functionality do not necessarily need to be collocated.

The order in which the embodiments/implementations and methods/processes are described is not intended to be construed as a limitation, and any number of the described implementations and processes may be combined.

The implementations herein are described in terms of exemplary embodiments. However, it should be appreciated that individual aspects of the implementations may be separately claimed and one or more of the features of the various embodiments may be combined.

Exemplary implementations/embodiments discussed herein may have various components collocated; however, it should be appreciated that the components of the arrangements may be combined into one or more apparatuses.

In some instances, well-known features are omitted or simplified to clarify the description of the exemplary implementations.

Although some aspects have been described in the context of an apparatus, these aspects also represent a description of the corresponding method, where a block or device corresponds to a method step or a feature of a method step. Analogously, aspects described in the context of a method step also represent a description of a corresponding block or item or feature of a corresponding apparatus.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein.

The invention claimed is:

1. A sensor unit for use in measurement data acquisition, the sensor unit comprising:
   a first signal line configured to output a first digital sense signal based on a first analog sense signal, and to output a second digital sense signal based on a second analog sense signal; and
   a second signal line configured to selectively transmit either the first digital sense signal or the second digital sense signal,
   wherein a first resolution of the first digital sense differs from a second resolution of the second digital sense signal.

2. The sensor unit of claim 1, comprising:
   a first analog-to-digital converter configured to derive the first digital sense signal from the first analog sense signal, and
   a second analog-to-digital converter configured to derive the second digital sense signal from the second analog sense signal.

3. The sensor unit of claim 2, wherein:
   the first analog-to-digital converter is provided as a comparator configured to compare the first analog sense signal to a threshold value,
   the first digital sense signal is a one bit comparison result signal, and the second digital sense signal comprises a multi bit representation derived from the second analog sense signal.

4. The sensor unit of claim 3, wherein the sensor unit is configured to transmit, during a predetermined interval upon initialization, the one bit comparison result signal and, upon expiration of the predetermined interval, to transmit the second digital sense signal.

5. The sensor unit of claim 1, wherein the sensor unit is configured to detect the first analog sense signal and the second analog sense signal as a single analog signal that, at different times, represents values of a first physical quantity and values of a second physical quantity.

6. The sensor unit of claim 5, wherein the second physical quantity differs from the first physical quantity.

7. The sensor unit of claim 1, wherein the first analog-to-digital converter is provided as a comparator configured to compare the first analog sense signal to a threshold value, and
wherein the first digital sense signal is a one bit comparison result signal that indicates whether the first analog sense signal is less than or greater than the threshold value.

8. The sensor unit of claim 7, further comprising:
a selector configured to selectively transmit either the first digital sense signal or the second digital sense signal based upon a select signal.

9. The sensor unit of claim 8, wherein the select signal is output to the selector having a value that is based upon the one bit comparison result signal indicating whether the first analog sense signal is less than or greater than the threshold value.

10. A method for performing measurement data acquisition, the method comprising:
generating a first digital sense signal based on a first analog sense signal;
generating a second digital sense signal based on a second analog sense signal; and
selectively transmitting either the first digital sense signal or the second digital sense signal,
wherein a first resolution of the first digital sense signal differs from a second resolution of the second digital sense signal.

11. The method of claim 10, comprising:
deriving via a first analog-to-digital converter, the first digital sense signal from the first analog sense signal; and
deriving, via a second analog-to-digital converter, the second digital sense signal from the second analog sense signal.

12. The method of claim 11, further comprising:
comparing the first analog sense signal to a threshold value to obtain the first digital sense signal as a one bit comparison result signal, and wherein the second digital sense signal comprises a multi bit representation derived from the second analog sense signal.

13. The method of claim 12, wherein the act of selectively transmitting comprises:
transmitting, during a predetermined interval, the one bit comparison result signal and, upon expiration of the predetermined interval, transmitting the second digital sense signal.

14. The method unit of claim 10, wherein the first analog sense signal and the second analog sense signal are detected as a single analog signal that, at different times, represents values of a first physical quantity and values of a second physical quantity.

15. The method of claim 14, wherein the second physical quantity differs from the first physical quantity.

16. The method of claim 10, further comprising:
comparing the first analog sense signal to a threshold value to obtain the first digital sense signal as a one bit comparison result signal that indicates whether the first analog sense signal is less than or greater than the threshold value.

17. The method of claim 16, wherein the act of selectively transmitting comprises:
transmitting either the first digital sense signal or the second digital sense signal based upon a select signal.

18. The method of claim 17, wherein the select signal has a value that is based upon the one bit comparison result signal indicating whether the first analog sense signal is less than or greater than the threshold value.

* * * * *